US008872241B1

(12) United States Patent
Chang et al.

(10) Patent No.: US 8,872,241 B1
(45) Date of Patent: Oct. 28, 2014

(54) MULTI-DIRECTION WIRING FOR REPLACEMENT GATE LINES

(71) Applicant: International Buisness Machines Corporation, Armonk, NY (US)

(72) Inventors: Josephine B. Chang, Mahopac, NY (US); Michael A. Guillorn, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/897,568

(22) Filed: May 20, 2013

(51) Int. Cl.
*H01L 29/66* (2006.01)
*H01L 29/78* (2006.01)
*H01L 21/28* (2006.01)

(52) U.S. Cl.
CPC .... *H01L 21/28008* (2013.01); *H01L 29/66795* (2013.01); *H01L 29/785* (2013.01); *H01L 29/66545* (2013.01)
USPC .... 257/259; 257/288; 257/368; 257/E21.206; 257/E21.209

(58) Field of Classification Search
USPC .......... 257/259, 288, 368, E21.196, E21.206, 257/E21.209
See application file for complete search history.

(56) References Cited

U.S. PATENT DOCUMENTS

| | | | |
|---|---|---|---|
| 6,278,164 B1 * | 8/2001 | Hieda et al. ................... | 257/410 |
| 6,297,144 B1 | 10/2001 | Cheng et al. | |
| 6,693,315 B2 * | 2/2004 | Kuroda et al. ................ | 257/288 |
| 6,908,801 B2 * | 6/2005 | Saito ............................. | 438/199 |
| 7,029,963 B2 | 4/2006 | Abbott | |
| 8,088,685 B2 | 1/2012 | Lin et al. | |
| 2003/0051910 A1 | 3/2003 | Dyke et al. | |
| 2011/0014786 A1 | 1/2011 | Sezginer et al. | |
| 2011/0049635 A1 | 3/2011 | Carlson | |
| 2012/0104509 A1 * | 5/2012 | Matsumoto ................... | 257/369 |
| 2012/0211844 A1 | 8/2012 | Schloesser et al. | |
| 2014/0113417 A1 * | 4/2014 | Sardesai et al. .............. | 438/151 |
| 2014/0124840 A1 * | 5/2014 | Khakifirooz et al. ......... | 257/288 |
| 2014/0151756 A1 * | 6/2014 | Chang et al. .................. | 257/288 |

FOREIGN PATENT DOCUMENTS

| | | |
|---|---|---|
| CN | 102315127 A | 1/2012 |
| JP | 201114637 | 1/2011 |

OTHER PUBLICATIONS

Abercrombie et al., "Restrictive Design Rules and Their Impact on 22 nm Design and Physical Verification," Sep. 2009, IEEE.

* cited by examiner

*Primary Examiner* — Thanh V Pham
(74) *Attorney, Agent, or Firm* — Scully, Scott, Murphy & Presser, P.C.; Louis J. Percello, Esq.

(57) ABSTRACT

A post-planarization recess etch process is employed in combination with a replacement gate scheme to enable formation of multi-directional wiring in gate electrode lines. After formation of disposable gate structures and a planarized dielectric layer, a trench extending between two disposable gate structures are formed by a combination of lithographic methods and an anisotropic etch. End portions of the trench overlap with the two disposable gate structures. After removal of the disposable gate structures, replacement gate structures are formed in gate cavities and the trench simultaneously. A contiguous gate level structure can be formed which include portions that extend along different horizontal directions.

11 Claims, 24 Drawing Sheets

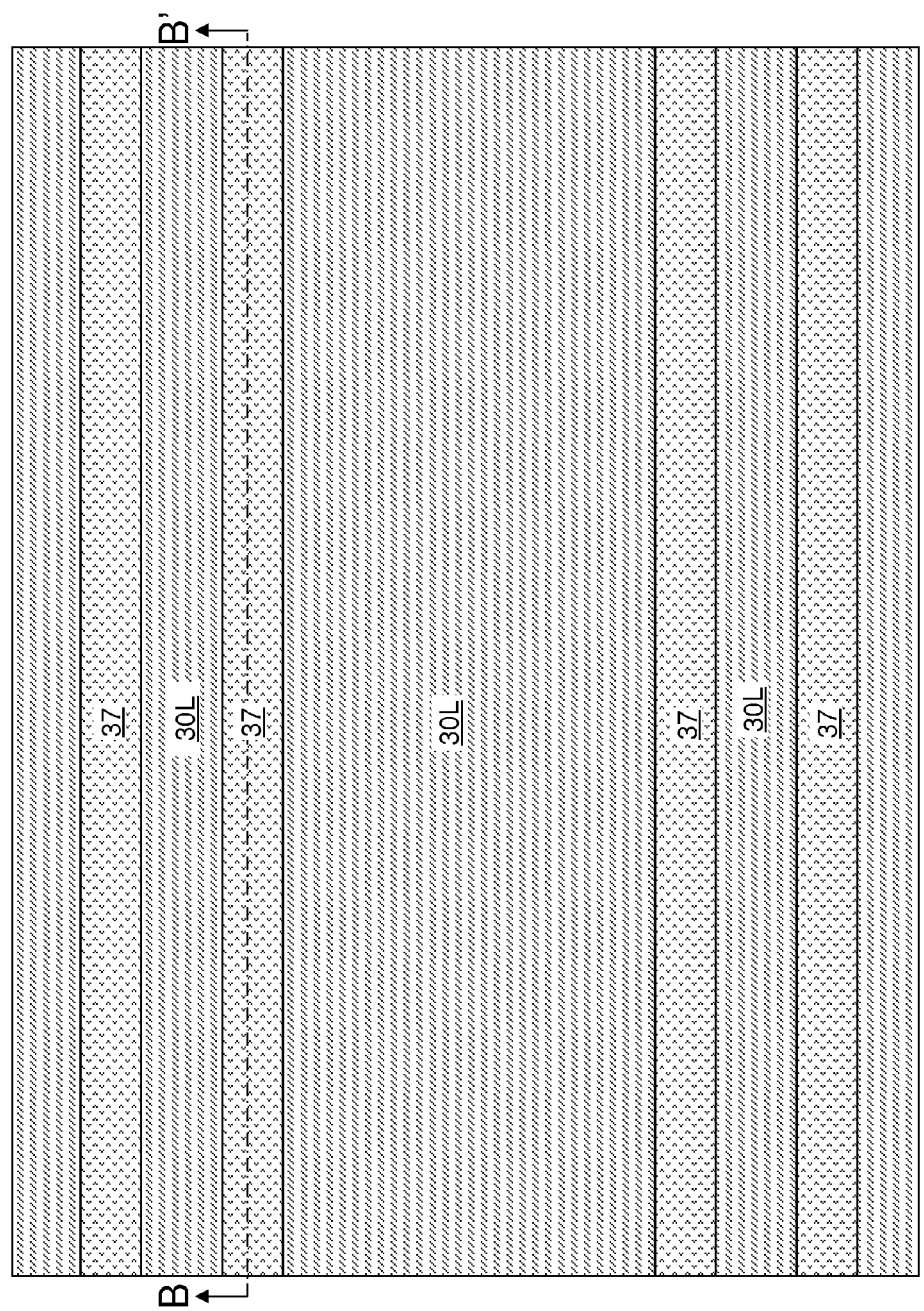

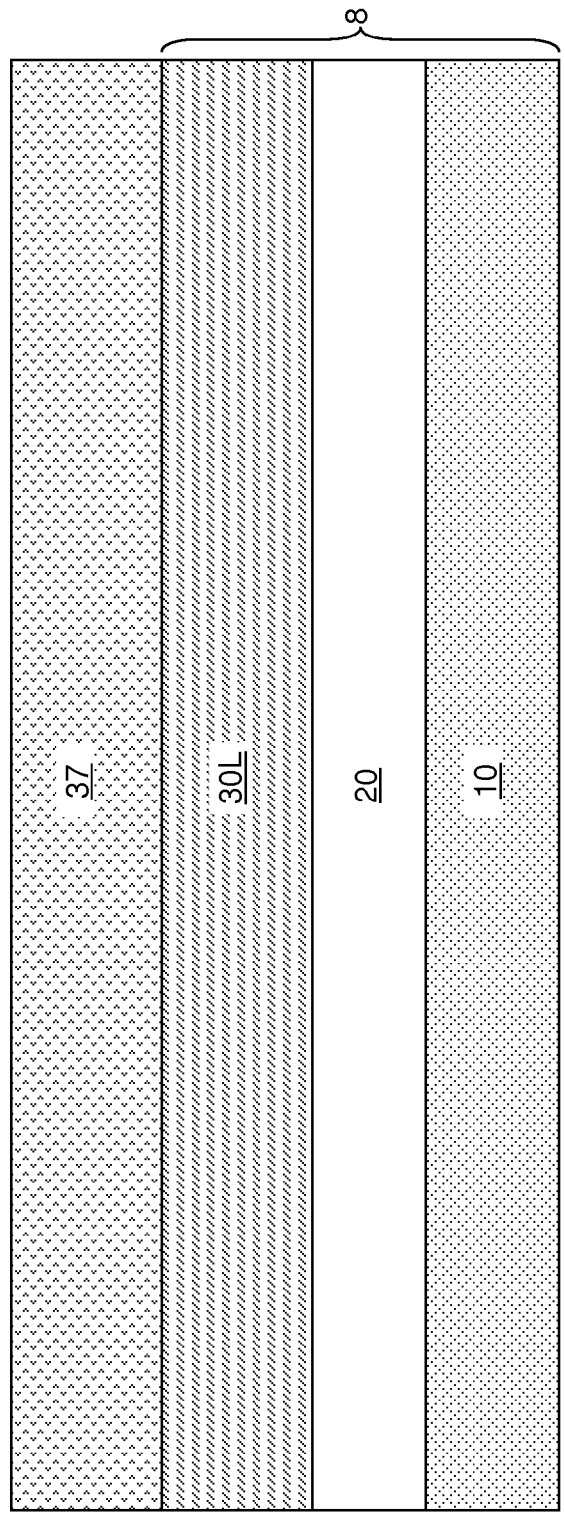

MULTI-DIRECTION WIRING FOR REPLACEMENT GATE LINES

BACKGROUND

The present disclosure generally relates to semiconductor structures, and particularly to a semiconductor structure including multi-direction wiring for replacement gate lines, and methods of manufacturing the same.

The difficulty of printing gate patterns for technologies with a small pitch on par with lithographic minimum dimensions has led to the development of unidirectional gate patterns, i.e., gate patterns that extend only along a single horizontal direction, and prohibits extension of the gate lines in any other horizontal direction. Unidirectional gate patterns shifts the burden of signal routing to metal interconnect structures provided above the gate level, e.g., by requiring more lateral connections to be formed in contact level metal interconnect structures and/or wiring level metal interconnect structures.

SUMMARY

A post-planarization recess etch process is employed in combination with a replacement gate scheme to enable formation of multi-directional wiring in gate electrode lines. After formation of disposable gate structures and a planarized dielectric layer, a trench extending between two disposable gate structures are formed by a combination of lithographic methods and an anisotropic etch. End portions of the trench overlap with the two disposable gate structures. After removal of the disposable gate structures, replacement gate structures are formed in gate cavities and the trench simultaneously. A contiguous gate level structure can be formed which include portions that extend along different horizontal directions.

According to an aspect of the present disclosure, a semiconductor structure includes a semiconductor material portion located on a substrate, which contains a source region, a drain region, and a body region. A planarization dielectric layer overlies the semiconductor material portion. The semiconductor structure further includes a gate stack structure embedded in the planarization dielectric layer and including a gate dielectric and a gate electrode that is embedded in the gate dielectric. The gate dielectric includes a horizontal portion in contact with the body region. The gate dielectric may also include a vertical portion having outer sidewalls that define a lateral extent of the gate stack structure. The gate stack structure includes a first portion contacting the semiconductor material portion and extending along a first horizontal direction and a second portion extending along a second horizontal direction that is different from the first direction.

According to another aspect of the present disclosure, a method of forming a semiconductor structure is provided. At least one semiconductor material portion is formed on a substrate. At least one disposable gate structure is formed over the at least one semiconductor material portion. A planarization dielectric layer is formed over the at least one semiconductor material portion and the at least one disposable gate structure. A trench is formed in the planarization dielectric layer. A sidewall of a remaining portion of one of the at least one disposable gate structure is physically exposed within the trench. At least one gate cavity is formed by removing the at least one disposable gate structure. A replacement gate stack structure is formed in the at least one gate cavity and the trench.

BRIEF DESCRIPTION OF SEVERAL VIEWS OF THE DRAWINGS

FIG. 1A is a top-down view of a first exemplary semiconductor structure after lithographic patterning of a first photoresist layer over a semiconductor-on-insulator (SOI) substrate according to a first embodiment of the present disclosure.

FIG. 1B is a vertical cross-sectional view of the first exemplary semiconductor structure along the vertical plane B-B' of FIG. 1A.

DETAILED DESCRIPTION

Figure 2A:
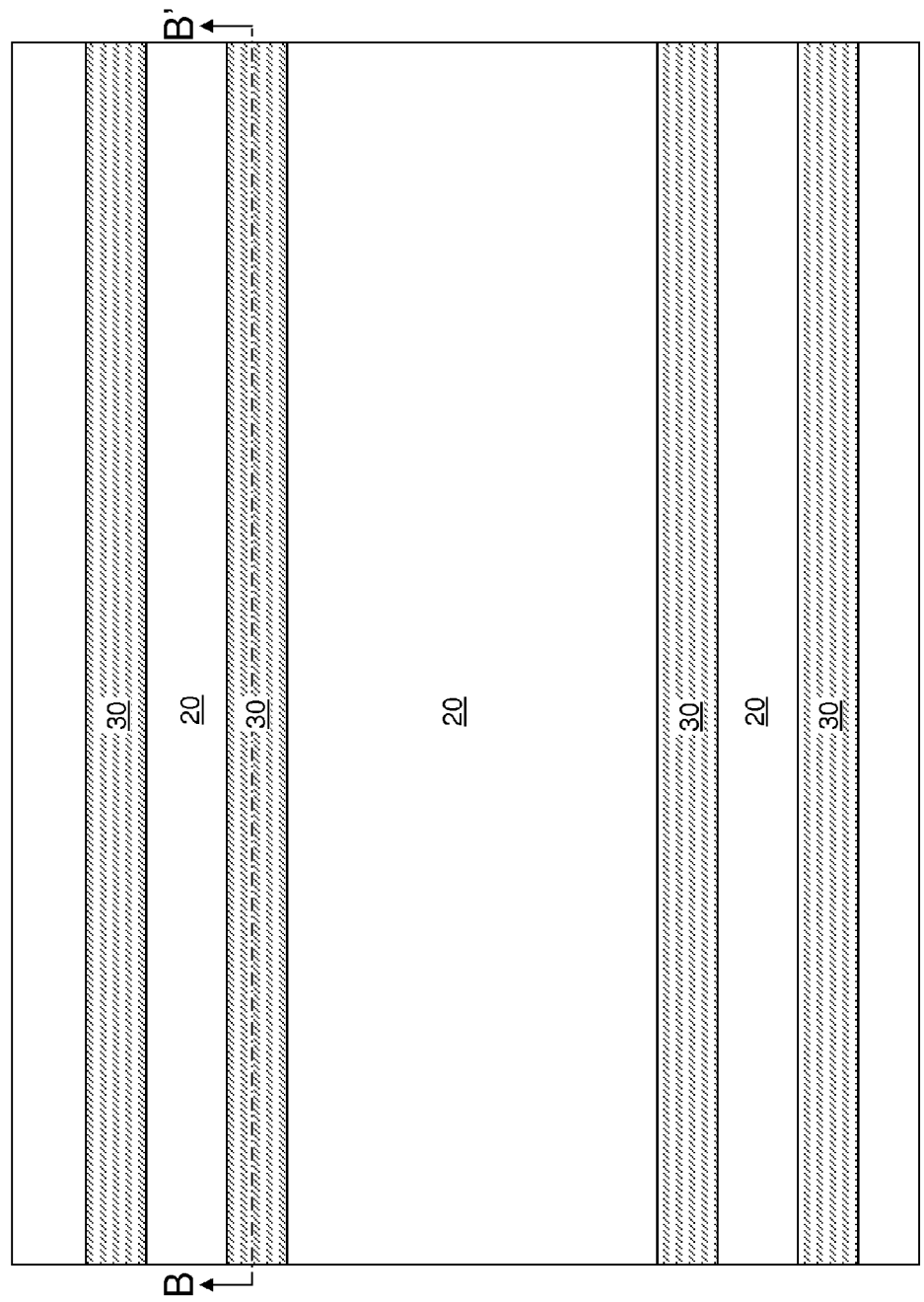
FIG. 2A is a top-down view of the first exemplary semiconductor structure after formation of a plurality of semiconductor fins by patterning a top semiconductor layer of the SOI substrate according to the first embodiment of the present disclosure.

As stated above, the present disclosure relates to a semiconductor structure including multi-direction wiring for replacement gate lines, and methods of manufacturing the same. Aspects of the present disclosure are now described in detail with accompanying figures. Like and corresponding elements mentioned herein and illustrated in the drawings are referred to by like reference numerals. The drawings are not necessarily drawn to scale. As used herein, ordinals are employed merely to distinguish similar elements, and different ordinals may be employed to designate a same element in the specification and/or claims.

Referring to FIGS. 1A and 1B, a first exemplary semiconductor structure according to a first embodiment of the present disclosure includes a substrate 8 and a first photoresist layer 37 formed thereupon. At least a topmost portion of the substrate 8 includes a semiconductor material. The substrate 8 can be a semiconductor-on-insulator (SOI) substrate, a bulk substrate, or a hybrid substrate including a bulk portion and an SOI portion.

In one embodiment, the substrate 8 can be an SOI substrate including a stack, from bottom to top, of a handle substrate 10, a buried insulator layer 20, and a top semiconductor layer 30L. The handle substrate 10 can include a semiconductor material, a conductive material, or a dielectric material, and provides mechanical support to the buried insulator layer 20 and the top semiconductor layer 30L. The thickness of the handle substrate 10 can be from 50 microns to 2 mm, although lesser and greater thicknesses can also be employed. The buried insulator layer 20 includes a dielectric material such as silicon oxide, silicon nitride, silicon oxynitride or a combination thereof. The thickness of the buried insulator layer 20 can be from 10 nm to 1,000 nm, although lesser and greater thicknesses can also be employed.

The top semiconductor layer 30L includes a semiconductor material, which can be an elemental semiconductor material such as silicon or germanium, an alloy of at least two elemental semiconductor materials such as a silicon-germanium alloy, a compound semiconductor material, or any other semiconductor material known in the art. The thickness of the top semiconductor layer 30L can be from 30 nm to 600 nm, although lesser and greater thicknesses can also be employed. The top semiconductor layer 30L can include a single crystalline semiconductor material, a polycrystalline semiconductor material, or an amorphous semiconductor material. Various portions of the top semiconductor layer 30L may be doped with electrical dopants, such as p-type dopants or n-type dopants, as needed. Different portions of the top semiconductor layer 30L may include different semiconductor materials. In one embodiment, the top semiconductor layer 30L includes a single crystalline semiconductor material such as single crystalline silicon and/or a single crystalline silicon-germanium alloy.

While the present disclosure is described employing an SOI substrate, embodiments employing a bulk substrate or a hybrid substrate including a bulk portion and an SOI portion are expressly contemplated herein.

The first photoresist layer 37 can be applied over the top semiconductor layer 30L and is lithographically patterned with a first pattern. The first pattern can be a line and space pattern in which each line extends along a horizontal direction, which is herein referred to as a fin direction. In one embodiment, the first pattern can include a plurality of material portions of the first photoresist layer 37 such that each of the plurality of material portions extends along a lengthwise direction. As used herein, a "lengthwise direction" of an object refers to a direction about which the moment of inertia of the object becomes the minimum.

In one embodiment, each of the plurality of material portions of the first photoresist layer 37 as patterned can have a same lengthwise direction, which is the fin direction. In one embodiment, each of the plurality of material portions of the first photoresist layer 37 can have a same width, which is the dimension along a horizontal direction that is perpendicular to the lengthwise direction. In one embodiment, each of the plurality of material portions of the first photoresist layer 37 as patterned can have a rectangular cross-sectional area such that the lengthwise edges of the rectangle representing the cross-sectional area are parallel to the lengthwise direction. In one embodiment, the width of each of the plurality of material portions of the first photoresist layer 37 as patterned can be a minimum lithographically printable dimension, i.e., a critical dimension, which is about 32 nm as of 2013.

The plurality of material portions of the first photoresist layer 37 can be laterally spaced along the widthwise direction of the first pattern, which is a horizontal direction perpendicular to the lengthwise direction of the first pattern. The lengthwise direction of the first pattern is the lengthwise direction of the plurality of material portions of the first photoresist layer 37.

In an alternate embodiment, layer 37 may be a masking layer generated using pitch double techniques such as Sidewall Image Transfer (SIT), and may have dimensions from about 4 nm to 30 nm, and pitches from about 10 nm to 60 nm. Pitch doubling techniques such as SIT including a mandrel, spacer, and cut process, are not described here, but are well known in the art.

Figure 2B:
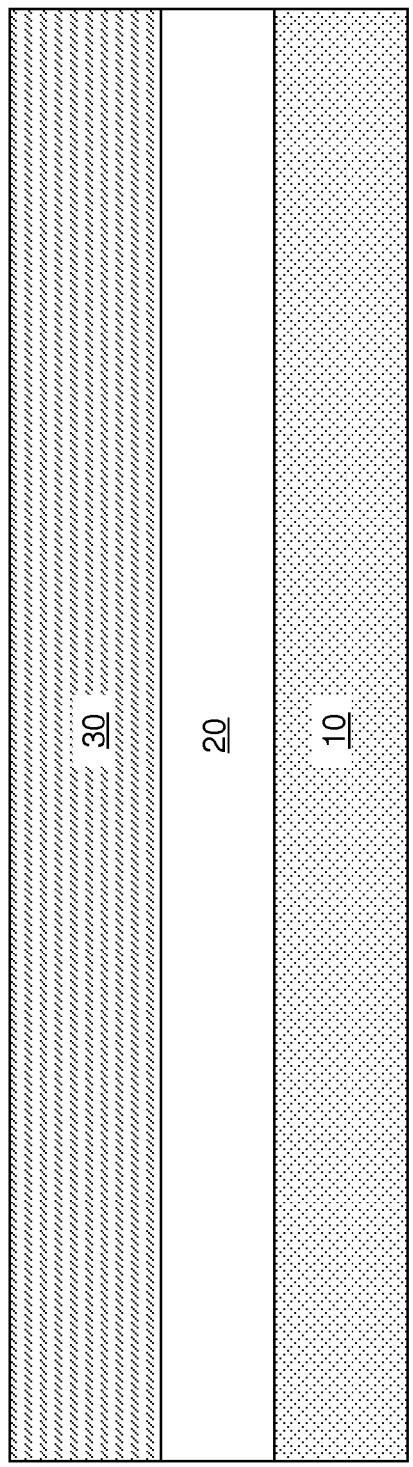
FIG. 2B is a vertical cross-sectional view of the first exemplary semiconductor structure along the vertical plane B-B' of FIG. 2A.

Referring to FIGS. 2A and 2B, the first pattern is transferred into a top portion of the substrate 8 to form at least one semiconductor material portion. The at least one semiconductor material portion can be a plurality of semiconductor material portions. In one embodiment, the plurality of semiconductor material portions can be a plurality of semiconductor fins 30. If the substrate 8 is an SOI substrate, the first pattern can be transferred through the top semiconductor layer 30L by an anisotropic etch employing the first photoresist layer 37 as an etch mask. The buried insulator layer 20 can be employed as a stopping layer for the anisotropic etch. The plurality of semiconductor fins 30 can be formed directly on the top surface of the buried insulator layer 20. If the substrate 8 is a bulk substrate, semiconductor fins formed by an anisotropic etch can be electrically isolated by forming shallow trench isolation structures (not shown) including a dielectric material and/or by forming doped wells that can be employed to form reverse biased p-n junctions. Each semiconductor fin 30 laterally extends along the fin direction, which is the lengthwise direction of the semiconductor fin 30.

Figure 3A:
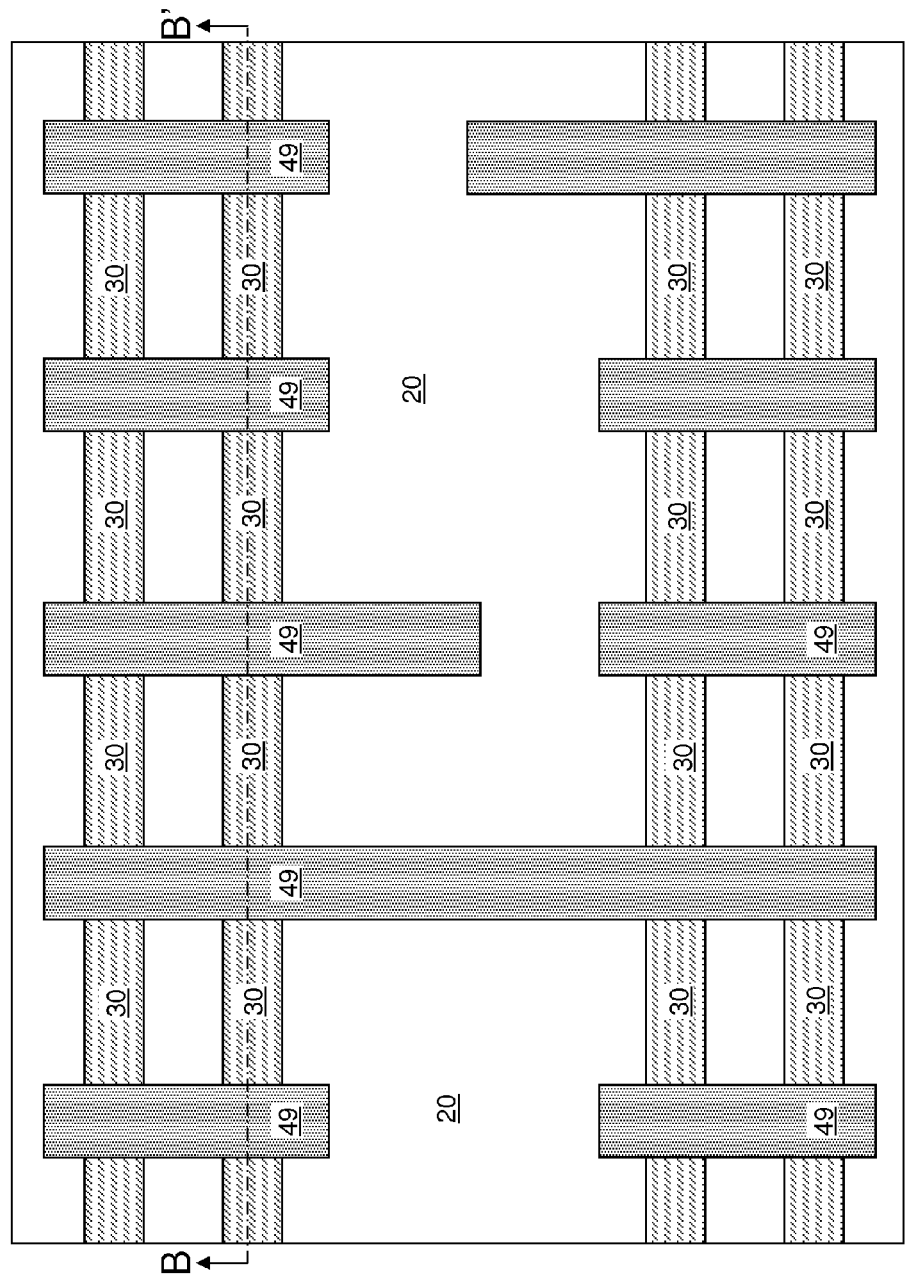
FIG. 3A is a top-down view of the first exemplary semiconductor structure after formation of a plurality of disposable gate structures according to the first embodiment of the present disclosure.
Figure 3B:
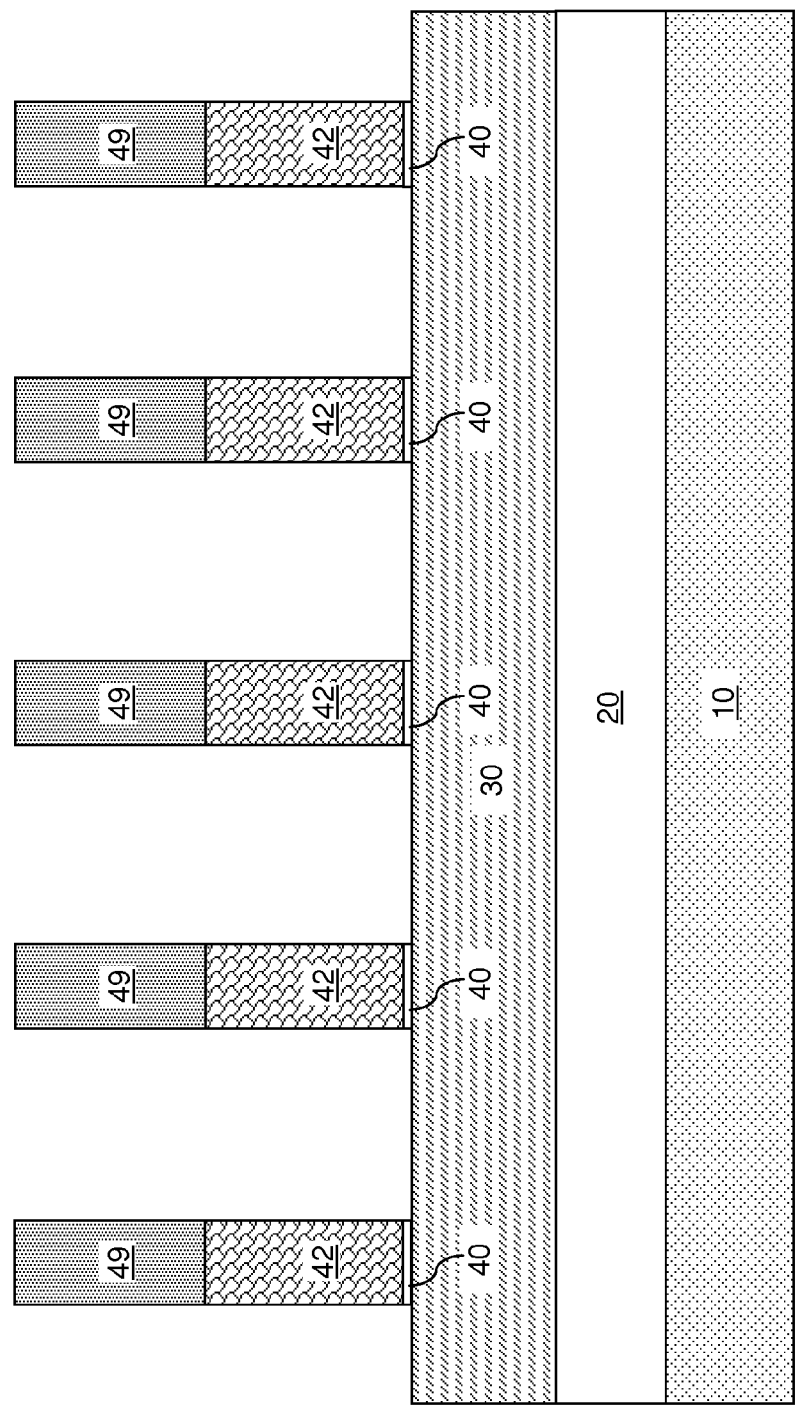
FIG. 3B is a vertical cross-sectional view of the first exemplary semiconductor structure along the vertical plane B-B' of FIG. 3A.

Referring to FIGS. 3A and 3B, disposable gate level layers can be deposited on the substrate 8 as blanket layers, i.e., as unpatterned contiguous layers. The disposable gate level layers can include, for example, a vertical stack of a gate dielectric layer, a disposable gate material layer, and a disposable gate cap dielectric layer. The disposable gate dielectric layer can be, for example, a layer of silicon oxide, silicon nitride, silicon oxynitride, or hafnium oxide. The thickness of the gate dielectric layer can be from 1 nm to 10 nm, although lesser and greater thicknesses can also be employed. The gate dielectric layer may be disposable or may be retained when the rest of the disposable gate stack removed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers can be lithographically patterned to form disposable gate structures. In one embodiment, a photoresist (not shown) is applied over the topmost surface of the disposable gate level layers and is lithographically patterned by lithographic exposure and development. In an alternate embodiment, a masking layer generated using pitch double techniques such SIT is used to generate gate patterns, the gate pattern in the photoresist or masking layer is transferred into the disposable gate level layers by an etch, which can be an anisotropic etch such as a reactive ion etch. The remaining portions of the disposable gate level layers after the pattern transfer constitute disposable gate structures.

Each disposable gate stack may include, for example, a stack of a gate dielectric portion 40, a disposable gate material portion 42, and a disposable gate cap portion 49. Each disposable gate stack (40, 42, 49) can straddle one or more of the plurality of semiconductor fins 30. Each disposable gate stack (40, 42, 49) can extend along a lengthwise direction, which is different from the fin direction. In one embodiment, a plurality of the disposable gate stacks (40, 42, 49) can extend along a same horizontal lengthwise direction, which is herein referred to as a first horizontal direction, or a first direction. In one embodiment, the first horizontal direction can be perpendicular to the fin direction. Each disposable gate stack (40, 42, 49) can have a pair of vertical sidewalls that extend along the first horizontal direction.

Figure 4A:
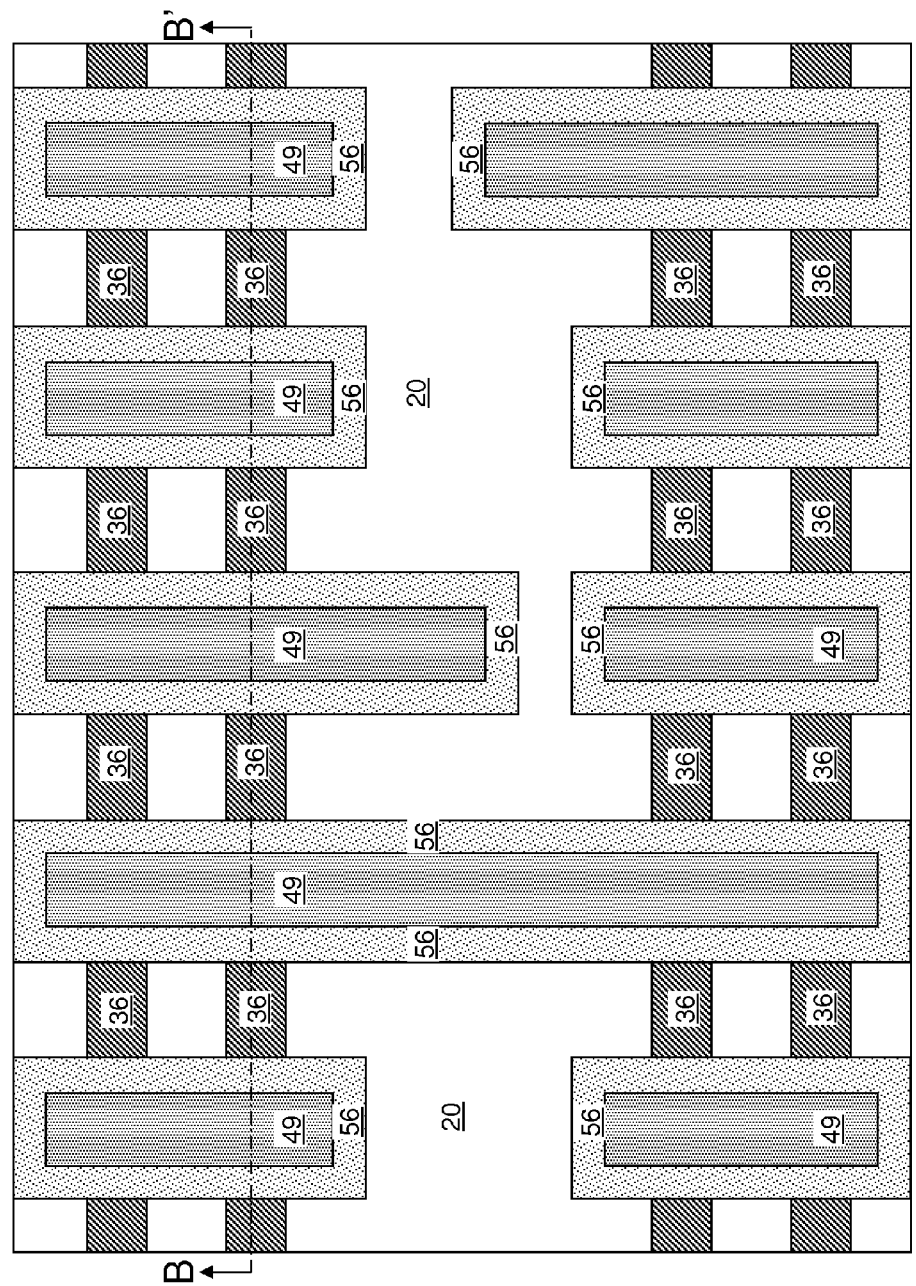
FIG. 4A is a top-down view of the first exemplary semiconductor structure after formation of gate spacers according to the first embodiment of the present disclosure.
Figure 4B:
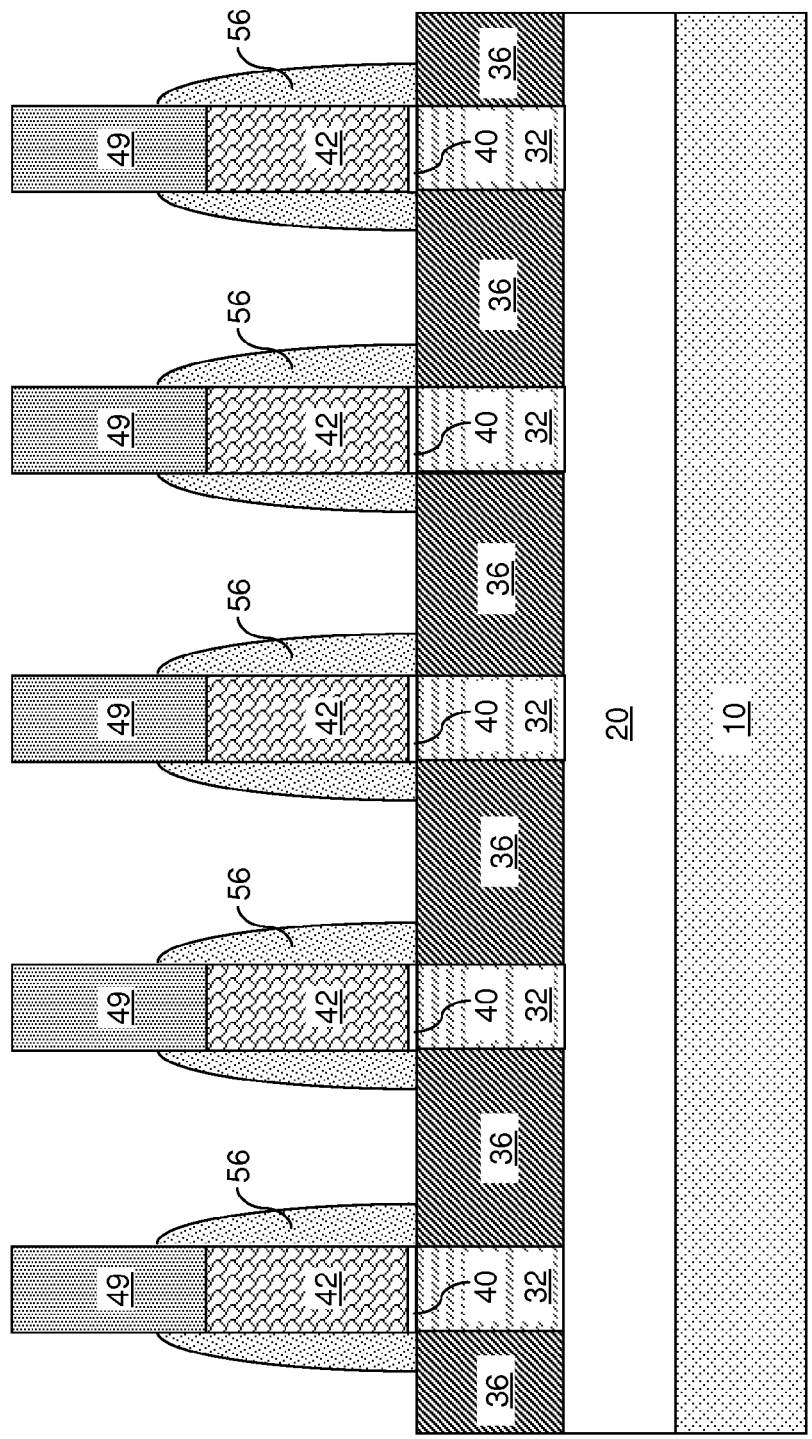
FIG. 4B is a vertical cross-sectional view of the first exemplary semiconductor structure along the vertical plane B-B' of FIG. 4A.

Referring to FIGS. 4A and 4B, gate spacers 56 can be formed on sidewalls of each of the disposable gate structures (40, 42, 49), for example, by deposition of a conformal dielectric material layer and an anisotropic etch. The conformal dielectric material layer includes a dielectric material such as silicon oxide, silicon nitride, silicon oxynitride, or a combination. Horizontal portions of the conformal dielectric material layer are removed by the anisotropic etch. An overetch can be employed to remove vertical portions of the conformal dielectric material layer from portions of sidewalls of the plurality of semiconductor fins 30 that are laterally spaced from the disposable gate stacks (40, 42, 49) by a lateral distance greater than the thickness of the conformal dielectric material layer. Remaining vertical portions of the conformal dielectric material layer constitute the gate spacers 56. The gate spacers 56 can contact the top surface of the buried insulator layer 20, i.e., can be formed directly on the top surface of the buried insulator layer 20.

Each gate spacer 56 laterally surrounds a disposable gate structure (40, 43, 49). Each gate spacer 56 can be topologically homeomorphic to a torus, i.e., can be continuously stretched without creating or destroying a hole into a torus. As used herein, two objects are "topologically homeomorphic" to each other if a continuous mapping and a continuous inverse mapping exists between two objects such that each point in one object corresponds to a distinct and unique point in another object. As used herein, a "continuous" mapping refers to a mapping that does not create or destroy a singularity.

Ion implantations can be employed to form various source/drain regions 36. As used herein, "source/drain regions" collectively refer to source regions and drain regions. Unimplanted portions of each semiconductor fin 30 are herein referred to as body regions 32. A p-n junction, a p-i junction, or an n-i junction can be formed between each neighboring pair of a source/drain region 36 and a body region 32. As used herein, a "p-i junction" is a junction between a p-doped region and an intrinsic region. As used herein, an "n-i junction" is a junction between an n-doped region and an intrinsic region. As used herein, an intrinsic region refers to an intrinsic portion of a semiconductor material, which does not include externally introduced electrical dopants such as p-type dopants or n-type dopants.

Figure 5A:
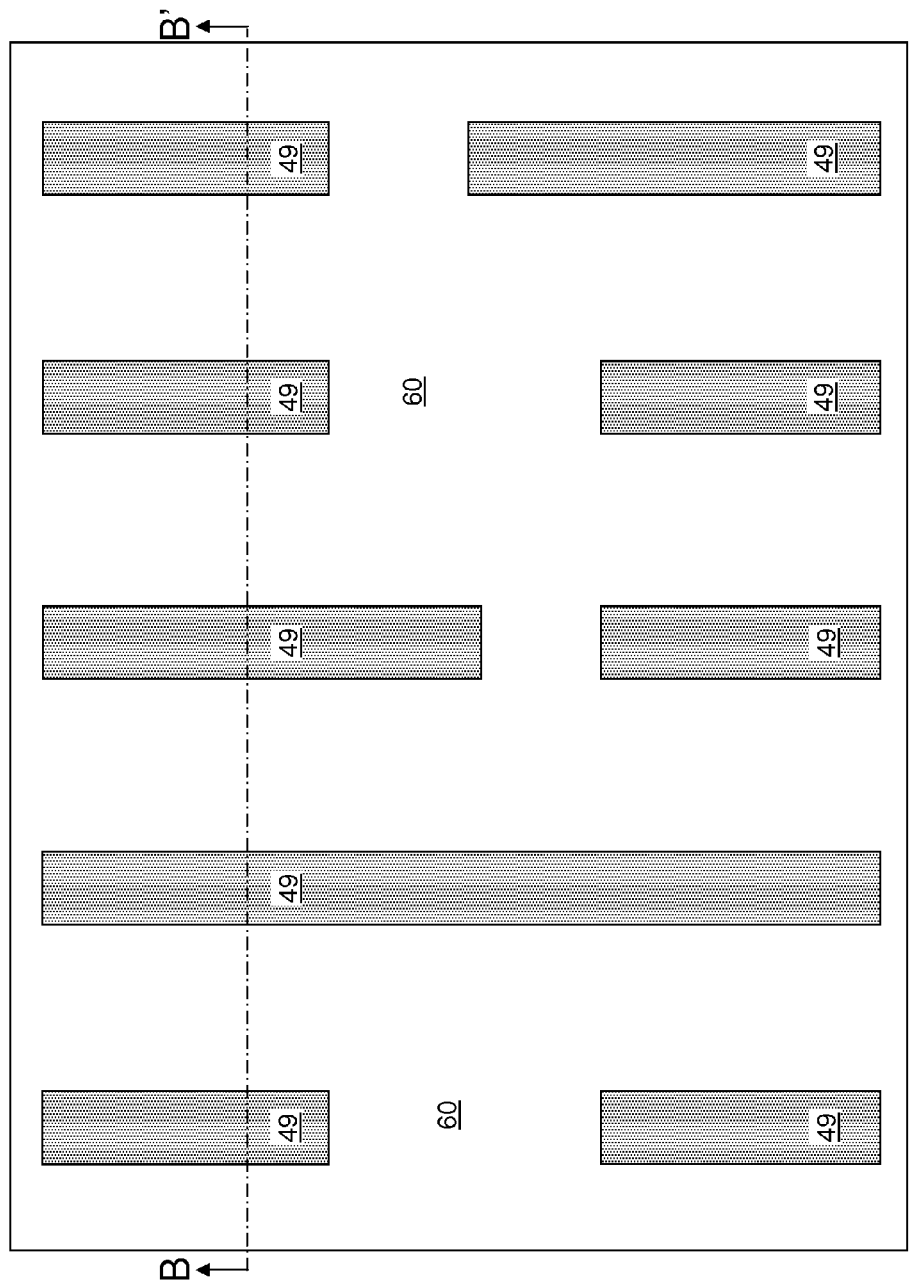
FIG. 5A is a top-down view of the first exemplary semiconductor structure after deposition and planarization of a planarization dielectric layer according to the first embodiment of the present disclosure.
Figure 5B:
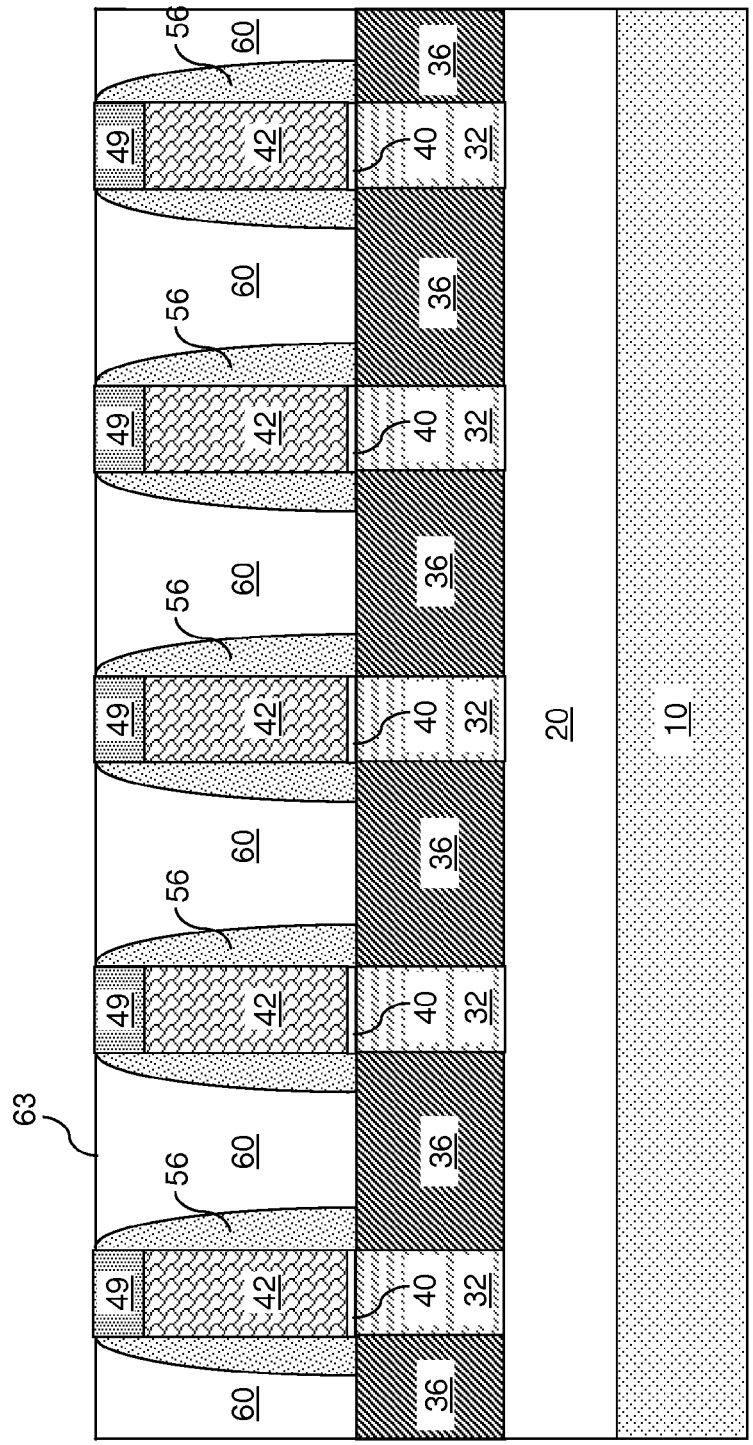
FIG. 5B is a vertical cross-sectional view of the first exemplary semiconductor structure along the vertical plane B-B' of FIG. 5A.

Referring to FIGS. 5A and 5B, a dielectric material layer can be deposited over the semiconductor fins (32, 36, 36') and the disposable gate structures (40, 42, 49). The deposited dielectric material layer is herein referred to as a planarization dielectric layer 60. The planarization dielectric layer 60 includes a dielectric material, which can be, for example, doped or undoped silicon oxide, silicon nitride, silicon oxynitride, or a combination thereof. In one embodiment, the planarization dielectric layer 60 includes silicon oxide. The planarization dielectric layer 60 can be deposited, for example, by chemical vapor deposition (CVD). The thickness of the planarization dielectric layer 60 as deposited can be controlled such that all portions of the top surface of the planarization dielectric layer 60 are located at, or above, top surfaces of the disposable gate cap portions 49 that are most proximal to the buried insulator layer 20.

The planarization dielectric layer 60 is subsequently planarized to provide a planar dielectric surface 63, for example, by chemical mechanical planarization (CMP). In one embodiment, upper portions of the disposable gate cap portion 49 can be employed as an endpoint layer during the planarization. An over-polish may be performed during the planarization so that the upper portions of each disposable gate cap portion 49 can be removed. The planarization dielectric layer 60 is subsequently planarized such that each top surface of a disposable gate cap portion 49 is physically exposed. After the planarization of the planarization dielectric layer 60, the planar dielectric surface 63 of the planarization dielectric layer 60 can be coplanar with each top surface of the disposable gate cap portions 49.

Figure 6A:
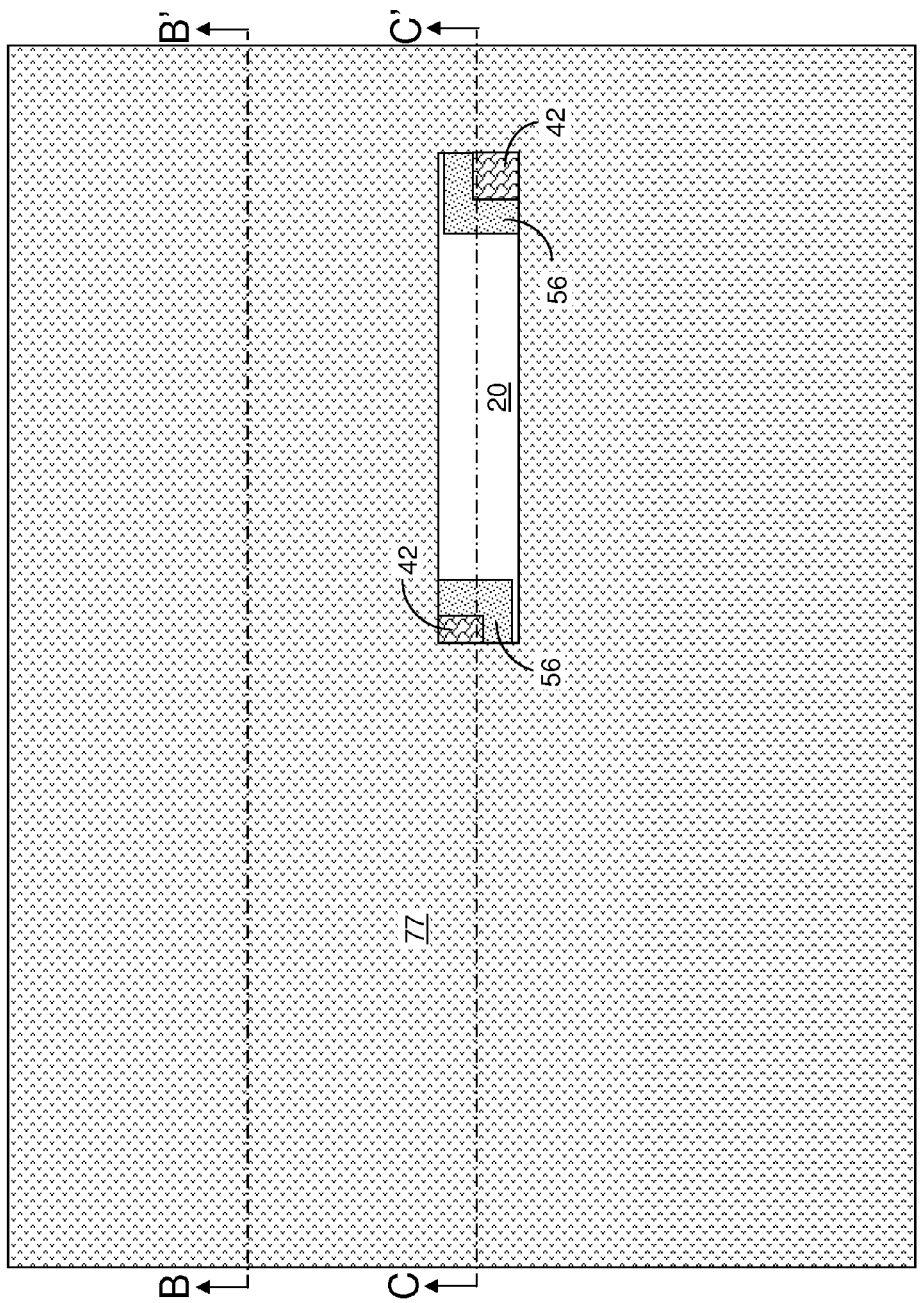
FIG. 6A is a top-down view of the first exemplary semiconductor structure after application and lithographic patterning of a third photoresist layer, and transfer of the pattern in the third photoresist layer into at least an upper portion of the planarization dielectric layer and upper portions of disposable gate structures and gate spacers according to the first embodiment of the present disclosure.
Figure 6B:
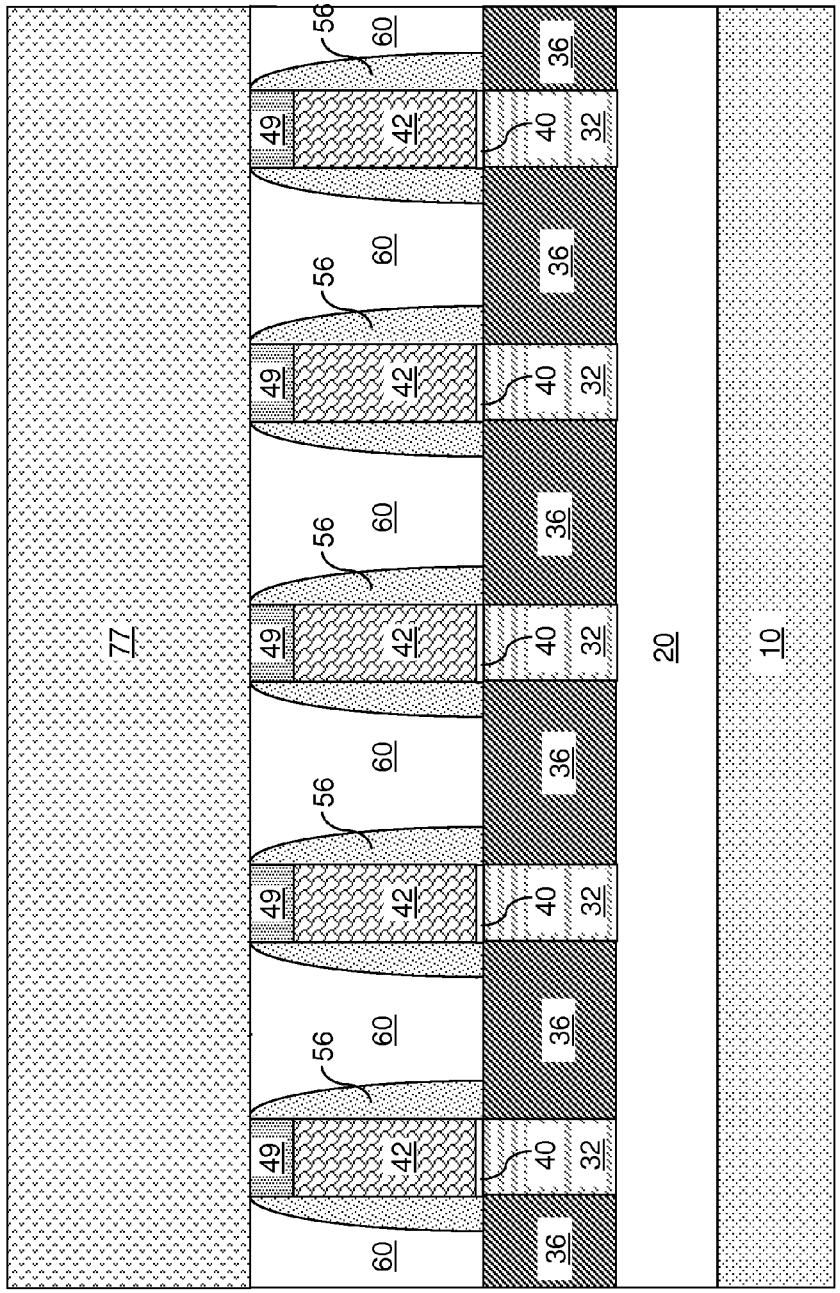
FIG. 6B is a vertical cross-sectional view of the first exemplary semiconductor structure along the vertical plane B-B' of FIG. 6A.
Figure 6C:
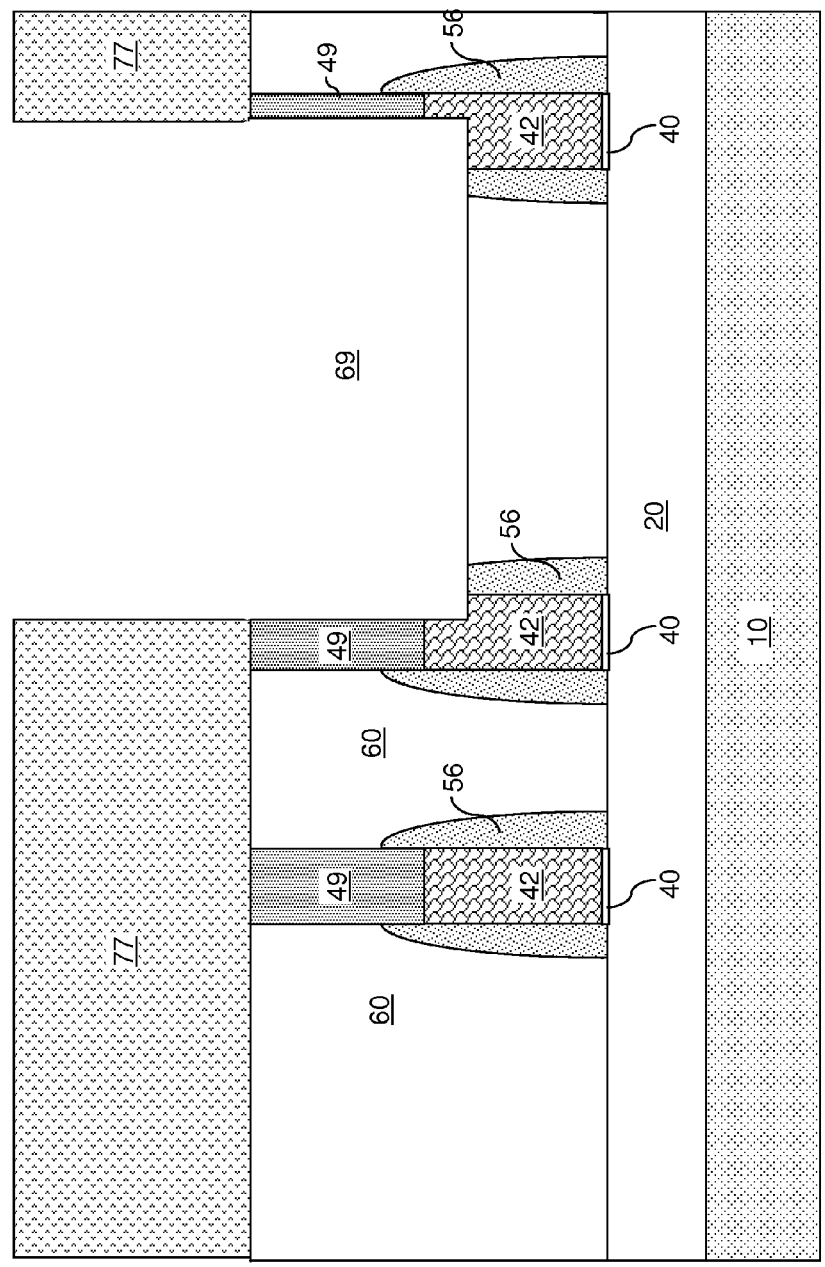
FIG. 6C is a vertical cross-sectional view of the first exemplary semiconductor structure along the vertical plane C-C' of FIG. 6A.

Referring to FIGS. 6A, 6B, and 6C, a third photoresist layer 77 can be applied over the planarization dielectric layer 60, and is lithographically patterned to form at least one opening therein. The location of each of the at least one opening can be selected in regions in which an additional conductive connection is desired among the wiring pattern provided by the disposable gate stack (40, 42, 49). The pattern in the third photoresist layer 77 is subsequently transferred into at least an upper portion of the planarization dielectric layer 60 and upper portions of the disposable gate structures (40, 42, 49) and gate spacers 56 by an etch, which can be an anisotropic etch such as a reactive ion etch. A trench 69 is formed in the planarization dielectric layer 60 within each area of an opening in the third photoresist layer 77. At least one sidewall of a remaining portion of each disposable gate structure (40, 42, 49) is physically exposed within the trench 69.

Sidewalls of the trench 69 may be substantially vertical, or can be tapered. In one embodiment, all sidewalls of the trench 69 can be substantially vertical. As used herein, a surface is "substantially vertical" if a vertical plane exists from which the surface deviates by not more than three times the root-mean-square roughness of the surface. In one embodiment, the trench 69 can extend between two disposable gate structures (40, 42, 49), and sidewalls of remaining portions of the two disposable gate structures (40, 42, 49) can be physically exposed within the trench 69. In another embodiment, the trench 69 can extend from a disposable gate structure (40, 42, 49) and does not extend to any other disposable gate structure (40, 42, 49), and sidewalls of a remaining portion of a disposable gate structure (40, 42, 49) can be physically exposed within the trench 69. In yet another embodiment, the trench 69 can extend among at least three disposable gate structures (40, 42, 49).

In one embodiment, the plurality of disposable gate structures (40 42, 49) can extend along the first horizontal direction, and the trench 69 can extend along a lateral direction that is different from the first horizontal direction. The lateral direction along which the trench extends is herein referred to as a second horizontal direction, or a second direction.

In one embodiment, at least an upper portion of at least one gate spacer 56 can be removed during the forming of the trench 69. In one embodiment, the area of the trench 69 can be selected such that the trench 69 does not overlie any semiconductor material portion over the buried insulator layer 20 (such as the semiconductor fins (32, 36, 36')) and is laterally offset from the semiconductor material portions.

In one embodiment, the bottom surface of the trench 69 can include a recessed surface of the planarization dielectric layer 60. In one embodiment, the bottom surface of the trench 69 can be located above the top surface of the buried insulator layer 20. In another embodiment, the bottom surface of the trench 69 can be coplanar with the top surface of the buried insulator layer 20. In yet another embodiment, the bottom surface of the trench 69 can be recessed below the top surface of the buried insulator layer 20. The third photoresist layer 77 is subsequently removed, for example, by ashing.

Figure 7A:
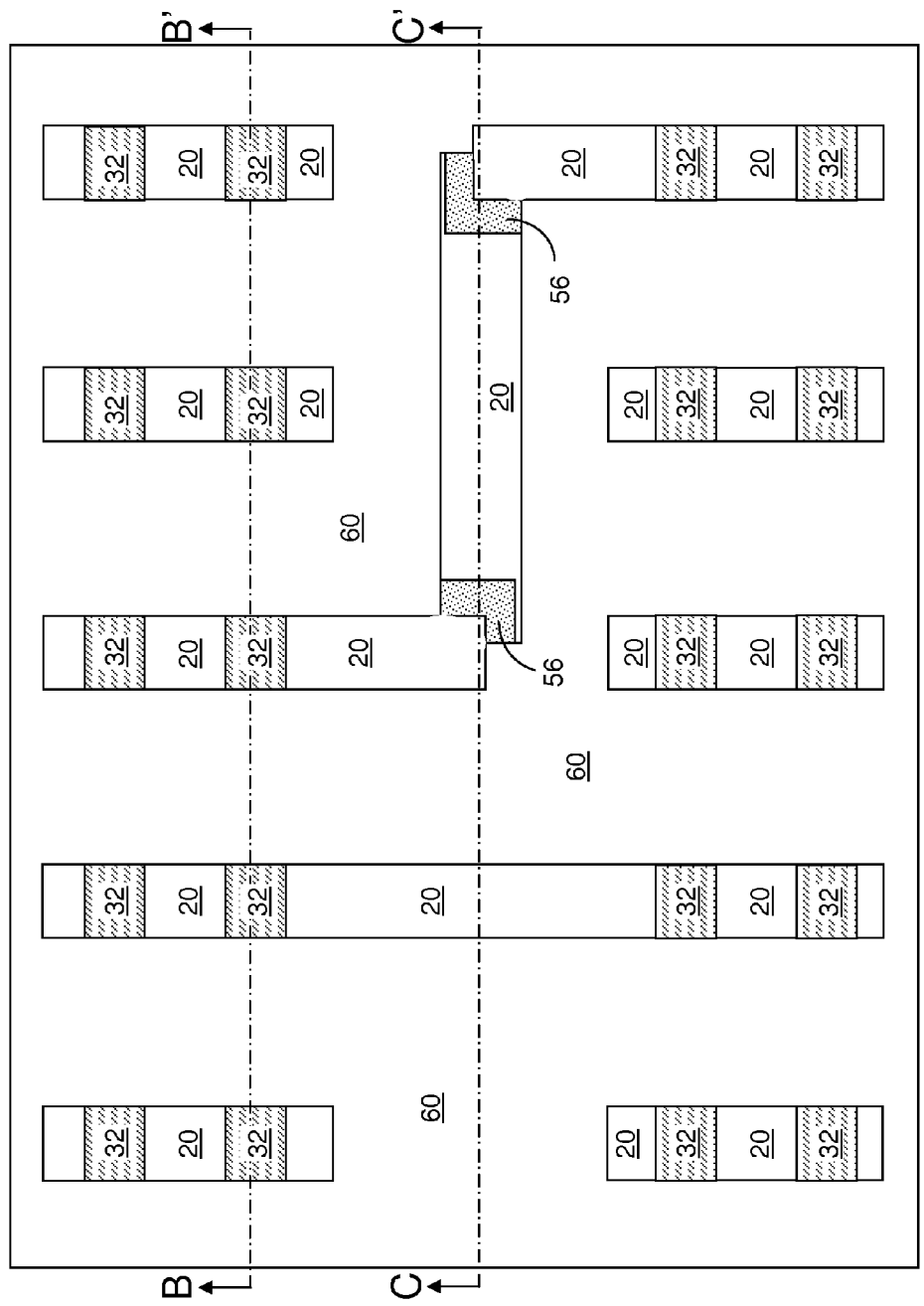
FIG. 7A is a top-down view of the first exemplary semiconductor structure after removal of disposable gate structures according to the first embodiment of the present disclosure.
Figure 7B:
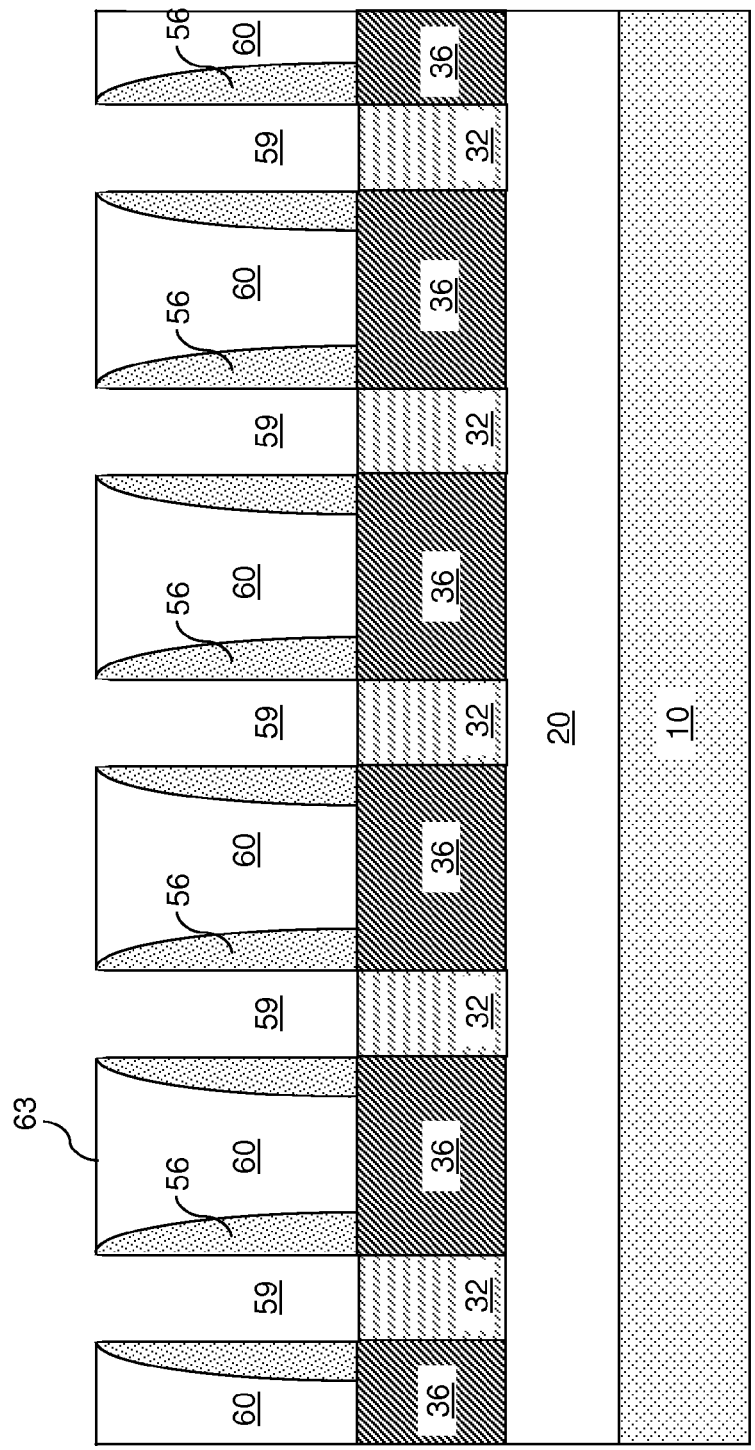
FIG. 7B is a vertical cross-sectional view of the first exemplary semiconductor structure along the vertical plane B-B' of FIG. 7A.
Figure 7C:
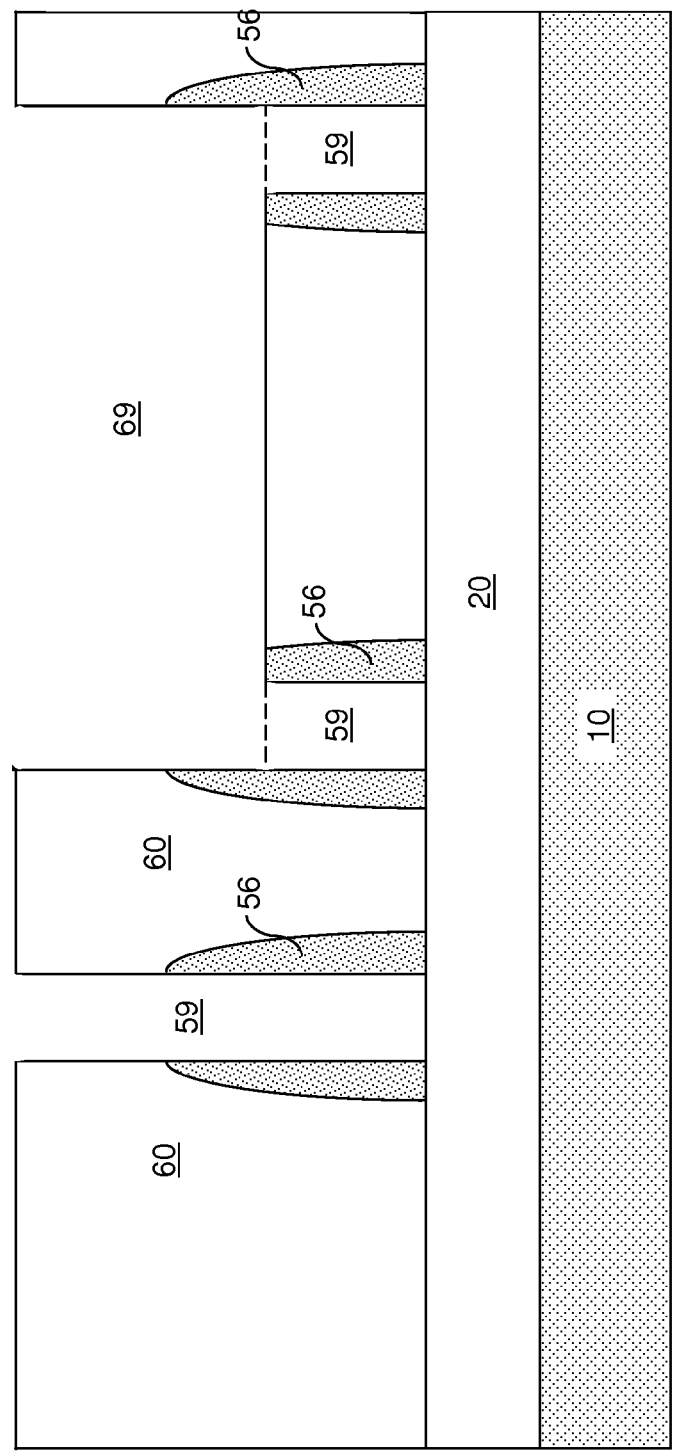
FIG. 7C is a vertical cross-sectional view of the first exemplary semiconductor structure along the vertical plane C-C' of FIG. 7A.

Referring to FIGS. 7A, 7B, and 7C, the disposable gate structures (40, 42, 49) can be partially or completely removed selective to the dielectric material of the planarization dielectric layer 60 and selective to the semiconductor material of semiconductor material portions (such as the semiconductor fins (32, 36, 36') above the buried insulator layer 20. A gate cavity 59 is formed in each space from which a disposable gate structure (40, 42, 49) is removed. Each trench 69 is contiguous with at least one gate cavity 59. In one embodiment, a trench 69 can be contiguous with two gate cavities 59. In another embodiment, a trench 69 can be contiguous with one gate cavity 59. In yet another embodiment, a trench 69 can be contiguous with at least three gate cavities 59.

Figure 8A:
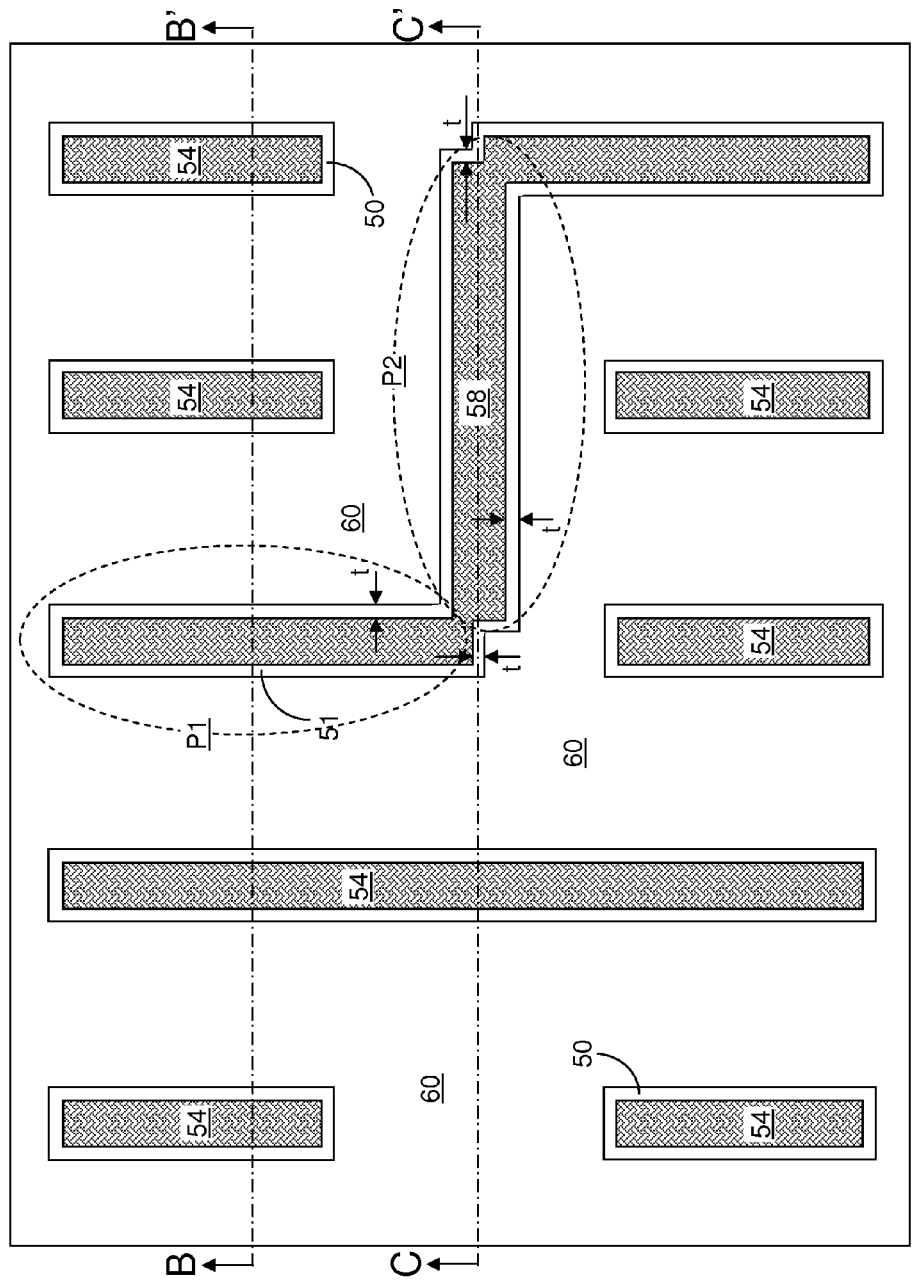
FIG. 8A is a top-down view of the first exemplary semiconductor structure after formation of replacement gate stack structures according to the first embodiment of the present disclosure.
Figure 8B:
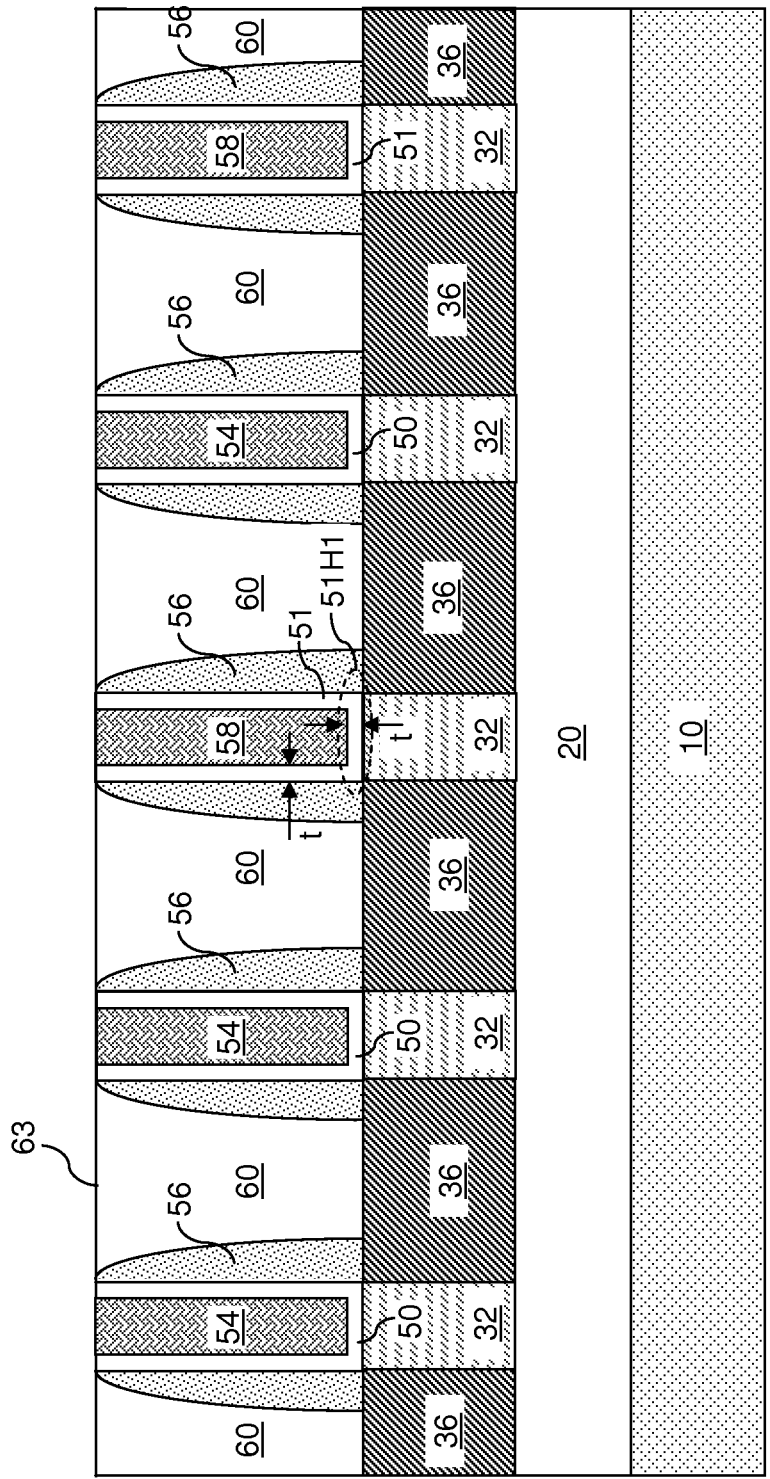
FIG. 8B is a vertical cross-sectional view of the first exemplary semiconductor structure along the vertical plane B-B' of FIG. 8A.
Figure 8C:
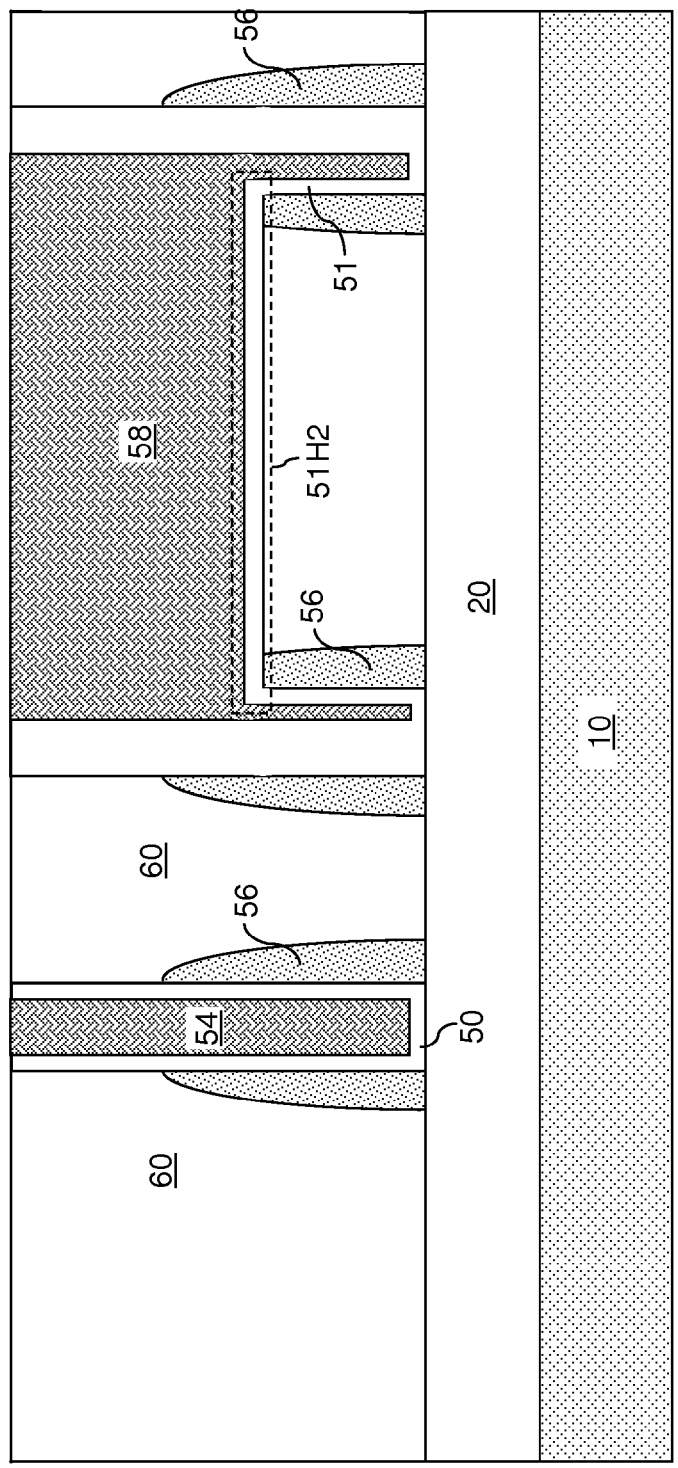
FIG. 8C is a vertical cross-sectional view of the first exemplary semiconductor structure along the vertical plane C-C' of FIG. 8A.

Referring to FIGS. 8A, 8B, and 8C, the gate cavities 59 and the trench(es) 69 can be filled with a gate stack which might include a dielectric layer and a must include a conductive material layer. The gate dielectric layer can include a dielectric metal oxide, a dielectric semiconductor oxide, or a combination thereof. In one embodiment, the gate dielectric layer can be deposited by a conformal deposition method such as atomic layer deposition (ALD) and/or chemical vapor deposition (CVD). In this case, all vertical portions of the gate dielectric layer can have a same thickness t. In one embodiment, horizontal portions of the gate dielectric layer can also have the thickness t.

Excess portions of the conductive material layer can be removed from above the top surface of the planarization dielectric layer 60, for example, by planarization. For example, chemical mechanical planarization (CMP) can be employed to remove the portions of the conductive material layer from above the top surface of the planarization dielectric layer 60. Portions of the gate dielectric layer may also be removed from above the top surface of the planarization dielectric layer 60. Remaining portions of the gate dielectric layer and the conductive material layer fill the gate cavities 59 and the trench(es) 69.

A remaining portion of the gate dielectric layer in a gate cavity 59 that is not connected to a trench 69 is herein referred to as a first-type gate dielectric 50. A remaining portion of the conductive material layer in a gate cavity 59 that is not connected to a trench 69 is herein referred to as a first-type gate electrode 54. A contiguous remaining portion of the gate dielectric layer that is present in a trench 69 and at least one gate cavity 59 is herein referred to as a second-type gate dielectric 51. A contiguous remaining portion of the conductive material layer that is present in a trench 69 and at least one gate cavity 59 is herein referred to as a second-type gate electrode 58. Each stack of a first-type gate dielectric 50 and a first-type gate electrode 54 constitutes a first-type replacement gate stack structure (50, 54), which is a gate stack structure including a replacement gate electrode. Each stack of a second-type gate dielectric 51 and a second-type gate electrode 58 constitutes a second-type replacement gate stack structure (51, 58), which is a gate stack structure including a replacement gate electrode. The first-type replacement gate stack structures (50, 54) and the second-type replacement gate stack structures (51, 58) are herein collectively referred to as replacement gate stack structures (50, 51, 54, 58). In one embodiment, all vertical portions of the first-type gate dielectric 50 and the second-type gate dielectric 51 can have the same thickness t. In one embodiment, all vertical portions and all horizontal portions of the first-type gate dielectric 50 and the second-type gate dielectric 51 can have the same thickness t.

The replacement gate stack structures (50, 51, 54, 58) can be simultaneously formed within the gate cavities 59 and the trench(es) 69. The replacement gate stack structures (50, 51, 54, 58) are embedded in the planarization dielectric layer 60. Each replacement gate stack structure (50, 51, 54, 58) includes a gate dielectric (50, 51) and a gate electrode (54, 58) that is embedded in the gate dielectric (50, 51). Each gate dielectric (50, 51) can include a horizontal portion in contact with a body region 32 and a vertical portion having outer sidewalls that define a lateral extent of the replacement gate stack structure (50, 51, 54, 58).

The first exemplary semiconductor structure includes interconnected field effect transistors. The first exemplary semiconductor structure includes at least a semiconductor material portion (i.e., one of the plurality of semiconductor fins (32, 36, 36')) including a source region (one of the source/drain regions 36), a drain region (another of the source drain regions 36), and a body region 32 and located on a substrate that includes the handle substrate 10 and the buried insulator layer 20. The planarization dielectric layer 60 overlies the semiconductor material portion. A second-type gate stack structure (51, 58) is embedded in the planarization dielectric layer 60 and including a second-type gate dielectric 51 and a second-type gate electrode 58 that is embedded in the second-type gate dielectric 51. The second-type gate dielectric 51 includes a horizontal portion 51H1 in contact with the body region 32 and a vertical portion having outer sidewalls that define a lateral extent of the second-type gate stack structure (51, 58).

The second-type gate stack structure (51, 58) includes a first portion P1 contacting the semiconductor material portion and extending along a first horizontal direction (i.e., the lengthwise direction of the first-type gate stack structures (50, 54)) and a second portion P2 extending along a second horizontal direction that is different from the first direction. The second horizontal direction may, or may not, be orthogonal to the first direction. In one embodiment, the second portion P2 does not overlie the semiconductor material portion, and is laterally offset, i.e., is spaced, from the semiconductor material portion.

Each of the first-type and second-type gate dielectrics (50, 51) can include a dielectric metal oxide having a dielectric constant greater than 8.0. The second-type gate dielectric 51 in the second portion P2 can further include another horizontal portion 51H2 that is vertically offset relative to the horizontal portion 51H1 that contacts the body region 32. In one embodiment, a bottom surface of the other horizontal portion 51H2 can be in contact with a horizontal surface of the planarization dielectric layer 60 that is located at a height between a topmost surface of the planarization dielectric layer 60 and a bottommost surface of the planarization dielectric layer 60. In one embodiment, semiconductor material portion can be a semiconductor fin (32, 36, 36') located on a buried insulator layer 20 in the substrate (10, 20), and the bottom surface of the other horizontal portion 51H2 can be located in a horizontal plane located beneath a horizontal plane including a topmost surface of the semiconductor fin (32, 36, 36'). In another embodiment, semiconductor material portion is a semiconductor fin (32, 36, 36') located on a buried insulator layer 20 in the substrate 910, 20), and the bottom surface of the other horizontal portion 51H2 can be located in a horizontal plane located above a horizontal plane including a topmost surface of the semiconductor fin (32, 36, 36').

Figure 9A:
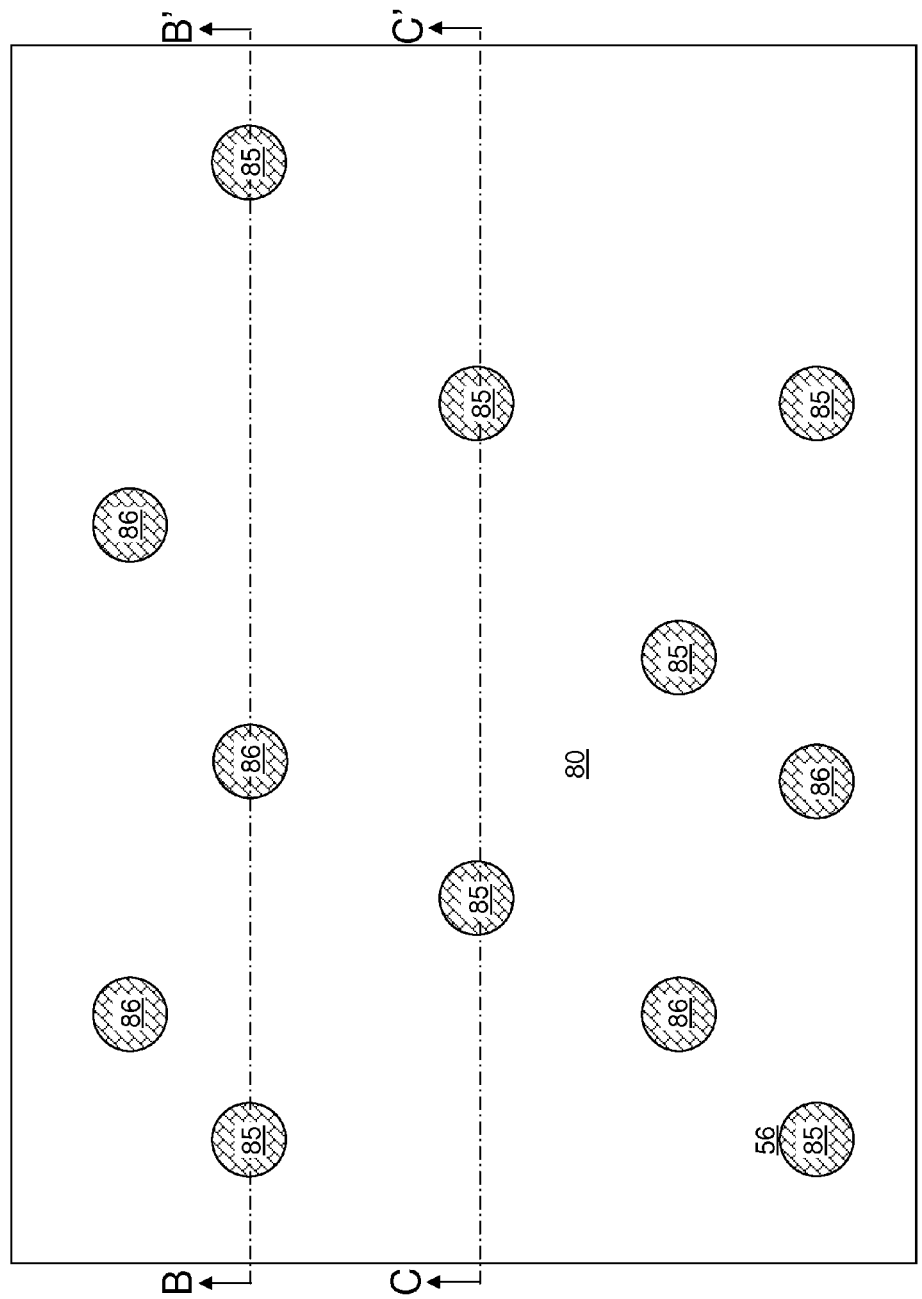
FIG. 9A is a top-down view of the first exemplary semiconductor structure after formation of a contact-level dielectric layer and contact via structures according to the first embodiment of the present disclosure.
Figure 9B:
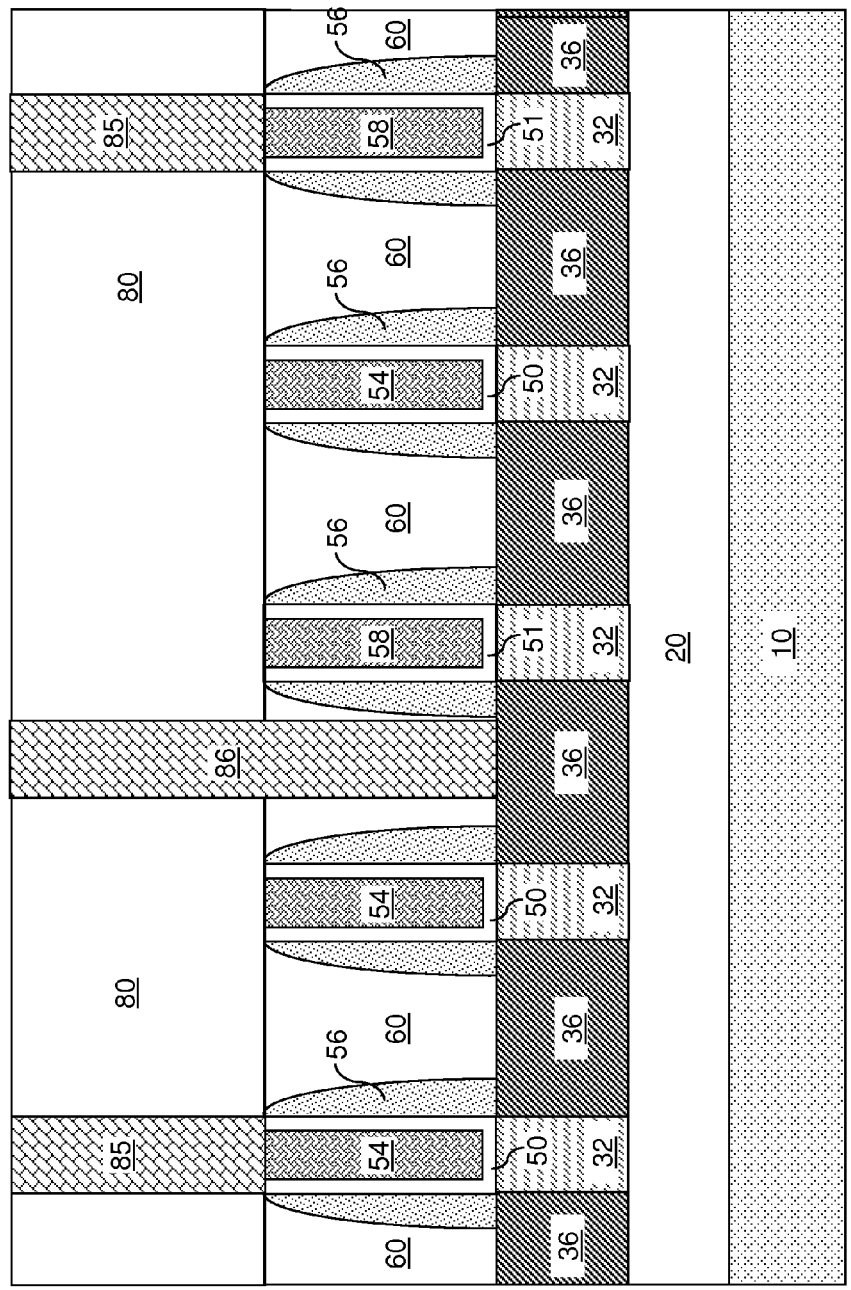
FIG. 9B is a vertical cross-sectional view of the first exemplary semiconductor structure along the vertical plane B-B' of FIG. 9A.
Figure 9C:
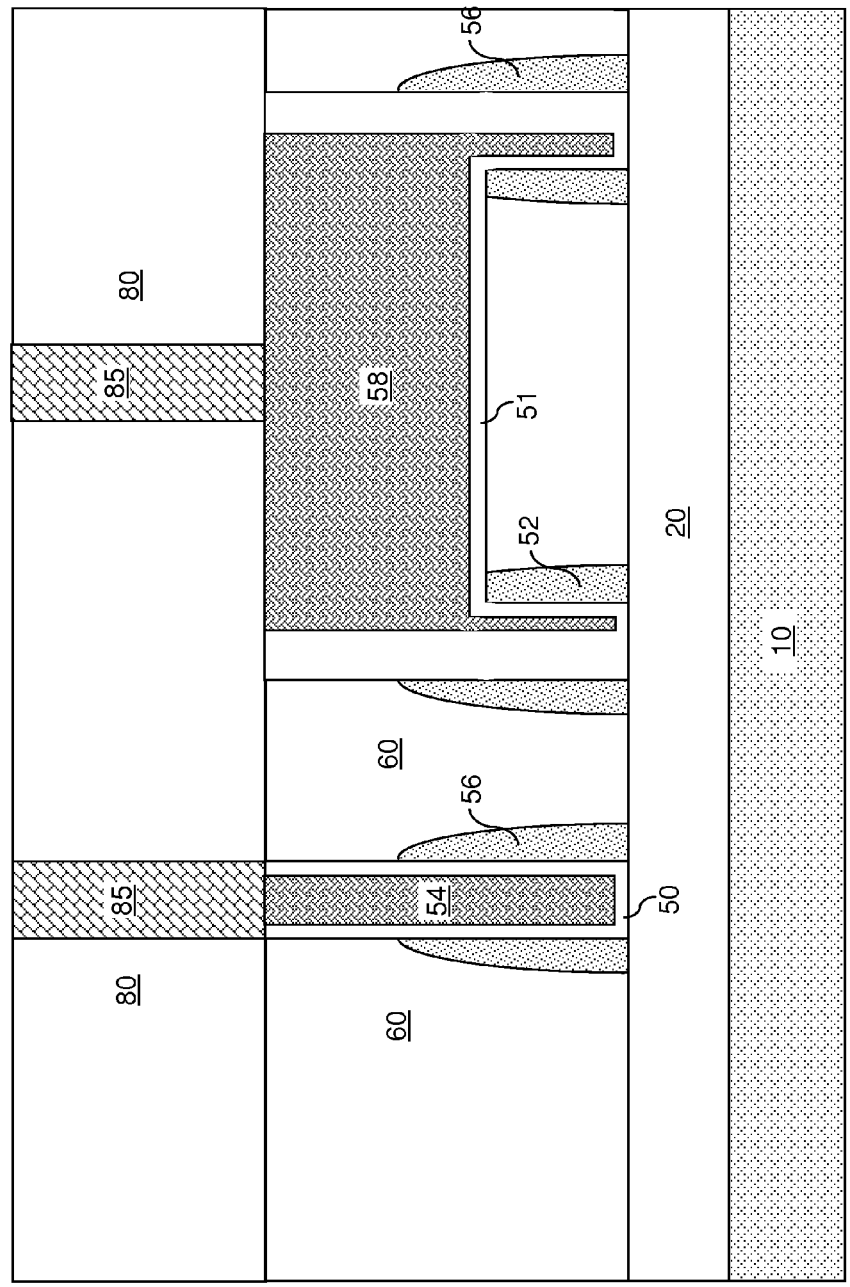
FIG. 9C is a vertical cross-sectional view of the first exemplary semiconductor structure along the vertical plane C-C' of FIG. 9A.

Referring to FIGS. 9A, 9B, and 9C, a contact-level dielectric layer 80 can be deposited over the planarization dielectric layer 60. Various contact via structures can be formed through the contact-level dielectric layer 80. The various contact via structures can include, for example, gate contact via structures 85 that extend through the contact-level dielectric layer 80 and contact one of the gate electrodes (54, 58), and active region contact via structures 86 that extend through a stack of the contact-level dielectric layer 80 and the planarization dielectric layer 60 and contact the source/drain regions 36. Optionally, at least one metal semiconductor alloy portions (not shown) can be formed between the contact via structures (85, 86) and the source/drain regions 36 or gate electrodes (54, 58).

Figure 10:
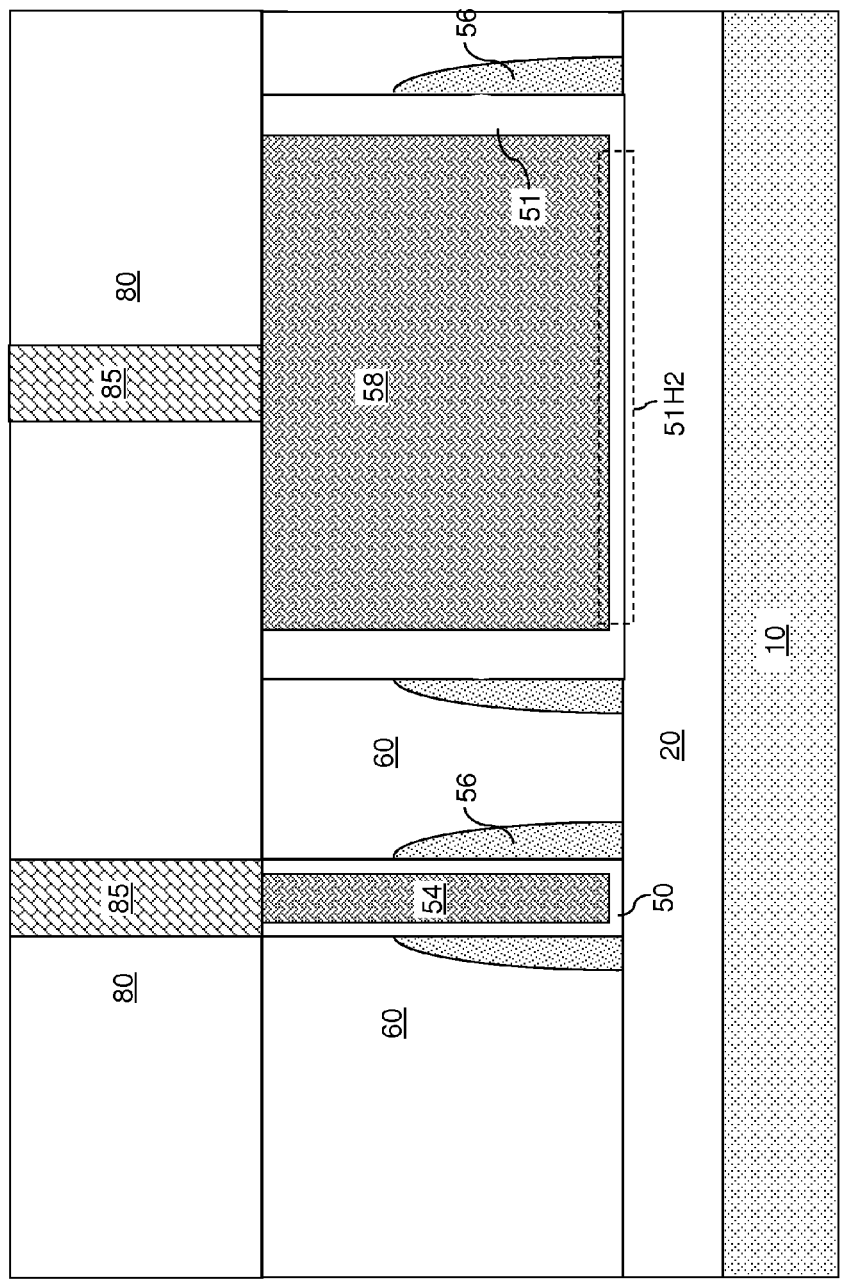
FIG. 10 is a vertical cross-sectional view of a second exemplary semiconductor structure according to a second embodiment of the present disclosure.

Referring to FIG. 10, a second exemplary semiconductor structure can be derived from the first exemplary semiconductor structure by increasing the depth of the trench(es) 69. In this case, a semiconductor material portion (e.g., one of the semiconductor fins (32, 36, 36')) can be located on the buried insulator layer 20, and a bottom surface of the other horizontal portion 51H2 of the second-type gate dielectric 51 can be in contact with a surface of the buried insulator layer 20. In one embodiment, the bottom surface of the other horizontal portion 51H2 can be coplanar with a topmost surface of the buried insulator layer 20.

Figure 11:
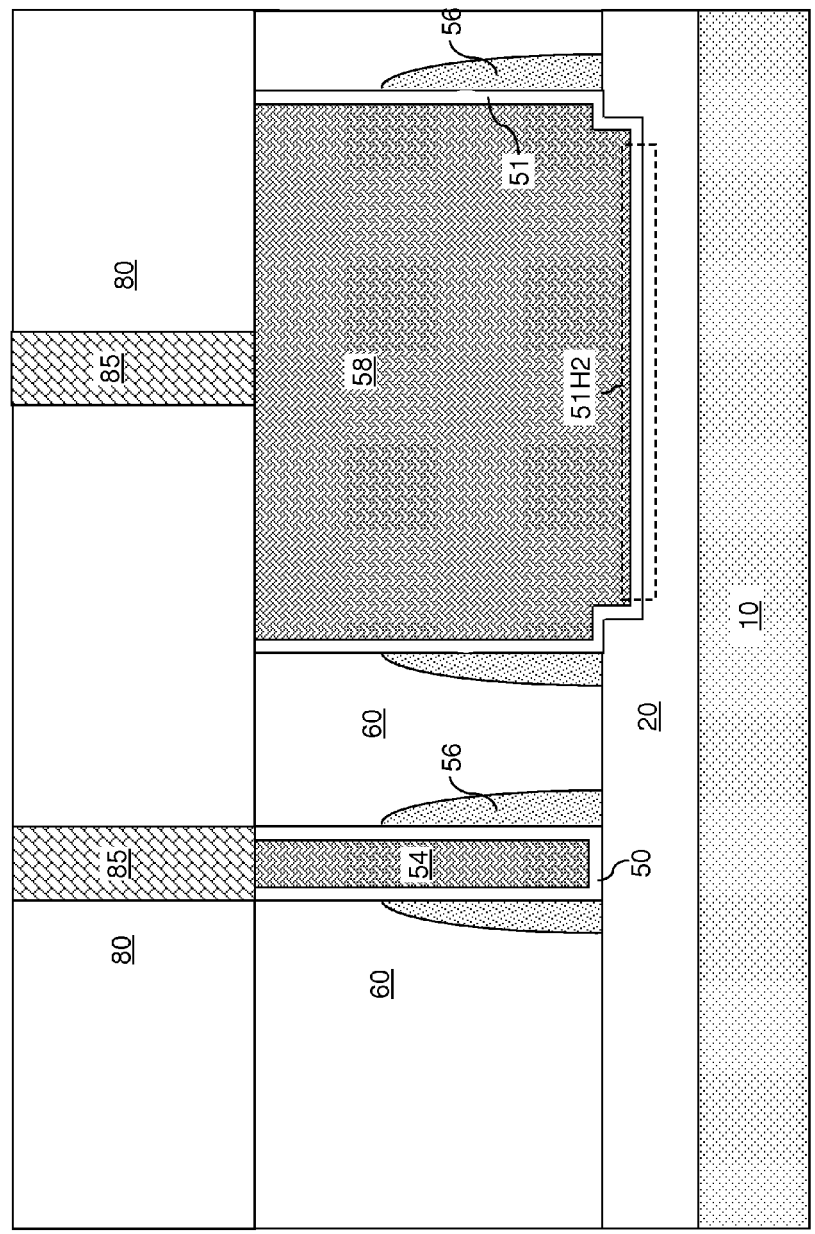
FIG. 11 is a vertical cross-sectional view of a third exemplary semiconductor structure according to the third embodiment of the present disclosure.

Referring to FIG. 11, a third exemplary semiconductor structure can be derived from the first exemplary semiconductor structure by increasing the depth of the trench(es) 69. In this case, a semiconductor material portion (e.g., one of the semiconductor fins (32, 36, 36')) can be located on the buried insulator layer 20, and a bottom surface of the other horizontal portion 51H2 of the second-type gate dielectric 51 can be in contact with a surface of the buried insulator layer 20. In one embodiment, the bottom surface of the other horizontal portion 51H2 can be located below a topmost surface of the buried insulator layer 20.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
a semiconductor material portion located on a substrate and including a source region, a drain region, and a body region;
a planarization dielectric layer overlying said semiconductor material portion;
a gate stack structure embedded in said planarization dielectric layer and including a gate dielectric and a gate electrode embedded in said gate dielectric, wherein said gate dielectric includes a horizontal portion in contact with said body region and a vertical portion having outer sidewalls that define a lateral extent of said gate stack structure, and wherein said gate stack structure includes a first portion contacting said semiconductor material portion and extending along a first horizontal direction and a second portion extending along a second horizontal direction that is different from said first horizontal direction.

2. The semiconductor structure of claim 1, wherein said gate dielectric comprises a dielectric metal oxide having a dielectric constant greater than 8.0.

3. The semiconductor structure of claim 1, wherein said second portion does not overlie said semiconductor material portion and is laterally offset from said semiconductor material portion.

4. The semiconductor structure of claim 3, wherein said gate dielectric further comprises another horizontal portion within said second portion, wherein said another horizontal portion is vertically offset relative to said horizontal portion.

5. The semiconductor structure of claim 4, wherein a bottom surface of said another horizontal portion is in contact with a horizontal surface of said planarization dielectric layer that is located at a height between a topmost surface of said planarization dielectric layer and a bottommost surface of said planarization dielectric layer.

6. The semiconductor structure of claim 5, wherein semiconductor material portion is a semiconductor fin located on a buried insulator layer in said substrate, and said bottom surface of said another horizontal portion is located in a horizontal plane located beneath another horizontal plane including a topmost surface of said semiconductor fin.

7. The semiconductor structure of claim 5, wherein semiconductor material portion is a semiconductor fin located on a buried insulator layer in said substrate, and said bottom surface of said another horizontal portion is located in a horizontal plane located above another horizontal plane including a topmost surface of said semiconductor fin.

8. The semiconductor structure of claim 4, wherein said semiconductor material portion is a semiconductor fin located on a buried insulator layer.

9. The semiconductor structure of claim 4, wherein said semiconductor material portion is located on a buried insulator layer, and a bottom surface of said another horizontal portion is in contact with a surface of said buried insulator layer.

10. The semiconductor structure of claim 9, wherein said semiconductor material portion is located on a buried insulator layer, and a bottom surface of said another horizontal portion is located below a topmost surface of said buried insulator layer.

11. The semiconductor structure of claim 9, wherein said semiconductor material portion is located on a buried insulator layer, and a bottom surface of said another horizontal portion is coplanar with a topmost surface of said buried insulator layer.

* * * * *